(12) United States Patent
Inoue

(10) Patent No.: US 11,095,283 B2
(45) Date of Patent: Aug. 17, 2021

(54) DRIVE CONTROL APPARATUS FOR DRIVING A SWITCHING ELEMENT INCLUDING A SENSE ELEMENT

(71) Applicant: DENSO CORPORATION, Kariya (JP)

(72) Inventor: Takeshi Inoue, Kariya (JP)

(73) Assignee: DENSO CORPORATION, Kariya (JP)

( * ) Notice: Subject to any disclaimer, the term of this patent is extended or adjusted under 35 U.S.C. 154(b) by 147 days.

(21) Appl. No.: 16/303,635

(22) PCT Filed: May 16, 2017

(86) PCT No.: PCT/JP2017/018355
§ 371 (c)(1),
(2) Date: Nov. 20, 2018

(87) PCT Pub. No.: WO2017/199949
PCT Pub. Date: Nov. 23, 2017

(65) Prior Publication Data
US 2020/0144998 A1 May 7, 2020

(30) Foreign Application Priority Data

May 9, 2017 (JP) .............................. JP2017-093059

(51) Int. Cl.
*H03K 17/082* (2006.01)
(52) U.S. Cl.
CPC ................................ *H03K 17/0828* (2013.01)
(58) Field of Classification Search
CPC ...... H03K 17/06; H03K 17/063; H03K 17/08; H03K 17/082; H03K 17/0822; H03K 17/0824; H03K 17/0826; H03K 17/0828; H02H 3/08; H02H 3/087; H02H 3/10; H02H 3/105; H02H 9/02; H02H 9/021; H02H 9/023; H02H 9/025; H02H 9/04; H02H 9/041; H02H 9/043
USPC ...... 324/686; 361/93.1, 93.7, 93.9, 100, 101
See application file for complete search history.

(56) References Cited

U.S. PATENT DOCUMENTS

| 5,375,029 A | 12/1994 | Fukunaga et al. |
| 6,057,728 A | 5/2000 | Igarashi |
| 2002/0011874 A1 | 1/2002 | Takahashi et al. |

(Continued)

FOREIGN PATENT DOCUMENTS

| JP | H05-102815 A | 4/1993 |
| JP | H05-122036 A | 5/1993 |

(Continued)

OTHER PUBLICATIONS

Aug. 8, 2017 International Search Report issued in International Patent Application No. PCT/JP2017/018355.

*Primary Examiner* — Alex Torres-Rivera
*Assistant Examiner* — David A. Singh
(74) *Attorney, Agent, or Firm* — Oliff PLC

(57) ABSTRACT

A drive control apparatus for a switching element drives a switching element including a sense element, and includes a drive circuit that provides a gate driving signal to the switching element, a transient characteristic absorbing circuit that absorbs a transient characteristic of the sense element when the switching element is turned on, and a determination circuit that determines an overcurrent or a short-circuit state of the switching element from an output of the sense element.

5 Claims, 34 Drawing Sheets

(56) References Cited

U.S. PATENT DOCUMENTS

| | | | |
|---|---|---|---|
| 2002/0141126 A1* | 10/2002 | Tabata | H03K 17/0828 361/93.7 |
| 2002/0176215 A1* | 11/2002 | Hiyama | H03K 17/0828 361/93.1 |
| 2003/0206039 A1* | 11/2003 | Sakata | H02M 1/0845 327/108 |
| 2005/0099751 A1* | 5/2005 | Kumagai | H03K 17/0828 361/100 |
| 2008/0198526 A1 | 8/2008 | Hiyama | |
| 2008/0304197 A1* | 12/2008 | Higashi | H03K 17/0828 361/93.7 |
| 2009/0040796 A1 | 2/2009 | Lalithambika et al. | |
| 2010/0214710 A1 | 8/2010 | Kora | |
| 2012/0268146 A1 | 10/2012 | Nagao | |
| 2013/0063188 A1* | 3/2013 | Sogo | H03K 17/0828 327/109 |
| 2013/0083442 A1 | 4/2013 | Hiyama | |
| 2013/0207712 A1 | 8/2013 | Suzuki et al. | |
| 2015/0311692 A1* | 10/2015 | Hiyama | H03K 17/168 361/31 |
| 2016/0011266 A1* | 1/2016 | Osanai | G01R 31/42 324/762.01 |
| 2016/0211657 A1* | 7/2016 | Hayashi | H03K 17/0828 |
| 2017/0317669 A1* | 11/2017 | Kaeriyama | H03K 17/0828 |
| 2018/0062499 A1* | 3/2018 | Yamamoto | F02P 3/053 |
| 2018/0145503 A1* | 5/2018 | Minagawa | H02M 7/5387 |

FOREIGN PATENT DOCUMENTS

| | | |
|---|---|---|
| JP | 2001-197723 A | 7/2001 |
| JP | 2013-123329 A | 6/2013 |
| JP | 2014-110497 A | 6/2014 |

\* cited by examiner

WAVEFORM IN NORMAL STATE

WAVEFORM IN SHORT-CIRCUIT STATE

WAVEFORM IN NORMAL STATE

WAVEFORM IN NORMAL STATE (COMPARATIVE EXAMPLE)

DRIVE CONTROL APPARATUS FOR DRIVING A SWITCHING ELEMENT INCLUDING A SENSE ELEMENT

CROSS-REFERENCE TO RELATED APPLICATION

The present application claims the priority based on Japanese Patent Application No. 2016-101408 filed in the Japan Patent Office on May 20, 2016, and Japanese Patent Application No. 2017-93059 filed in the Japan Patent Office on May 9, 2017, and the entire description of which is incorporated herein by reference.

TECHNICAL FIELD

The present disclosure relates to a drive control apparatus for a switching element.

BACKGROUND ART

In a power semiconductor switching element, there is one that includes a sense element for monitoring a current flowing in itself. In such a switching element, a current value flowing in the switching element is estimated from a voltage of a sense resistor connected to the sense element. This enables protection operation when an overcurrent or a short-circuit of the switching element has occurred and, can reduce an element size by reducing a current capacity of the switching element.

In addition, in order to control a motor connected as a load or to reduce a switching loss or conduction loss, feedback can be performed for a gate driving control of the switching element, and thereby effects, such as reduction in the number of current sensors and efficiency improvement by loss reduction, can be expected.

CITATION LIST

Patent Literature

[PTL 1] JP 2008-206348 A
[PTL 2] JP 2013-123329 A
[PTL 3] JP 2014-110497 A

SUMMARY OF THE INVENTION

However, since conventionally, with the configuration of a current detection circuit of such a switching element, when the current is detected, a sense ratio deviates due to sense resistance, capacitance characteristics of the sense element, or the like, a problem that an accurate current cannot be detected is found.

For example, in Patent Literature 1, in order to accurately detect a current, it is configured to perform correction by an external circuit. However, with this configuration, a problem is found in which an external circuit is required and further it is difficult to follow the control of a transient change.

In addition, in Patent Literature 2, the configuration is adopted in which normal operation or abnormal operation, such as overcurrent or short-circuit, is determined from the difference between a sense output result and a gate voltage. However, with this configuration, since the gate voltage may change due to a load situation even during normal operation and a gate voltage wave shape is different every time also during abnormal operation, a problem that it is difficult to determine the abnormal operation is also found.

Then, in Patent Literature 3, the configuration is adopted which performs current detection protection by cancelling a capacitance variation amount from the sense output. However, since the setting of capacitor for cancelling the capacitance variation amount is difficult and the number of additional parts is large, a problem that practical adoption is difficult is found.

The present disclosure aims at providing a drive control apparatus for a switching element, the apparatus being capable of suppressing lifetime reduction of the switching element by rapidly detecting overcurrent with a simple and inexpensive configuration.

In a first aspect of the present disclosure, the drive control apparatus drives a switching element including a sense element, and includes a drive circuit that provides a gate driving signal to the switching element, a transient characteristic absorbing circuit that absorbs a transient characteristic of the sense element when the switching element is turned on, and a determination circuit that determines an overcurrent or a short-circuit state of the switching element from an output of the sense element.

With the adoption of the above configuration, since the transient characteristic absorbing circuit can absorb the transient characteristic generated when the switching element is turned on, the determination circuit can determine an overcurrent or a short-circuit state of the switching element from an output of the sense element without waiting for completion of the transient characteristic. This can prevent the current from continuing to flow in the switching element until the determination due to the overcurrent or the short-circuit, and thus, a configuration having a reduced current capacity can be used as the switching element.

BRIEF DESCRIPTION OF THE DRAWINGS

The object and other objects, characteristics and advantages of the present disclosure will become clearer from the detail description below with reference to the accompanying drawings. In the drawings.

DESCRIPTION OF EMBODIMENTS

First Embodiment

The first embodiment will be described below with reference to FIG. 1 to FIG. 5.

In the first embodiment, a first system will be described that monitors a gate voltage to rapidly detect a state, such as overcurrent or short-circuit, of an IGBT 1, which is a switching element, and allow a protection operation to be performed.

Figure 1:
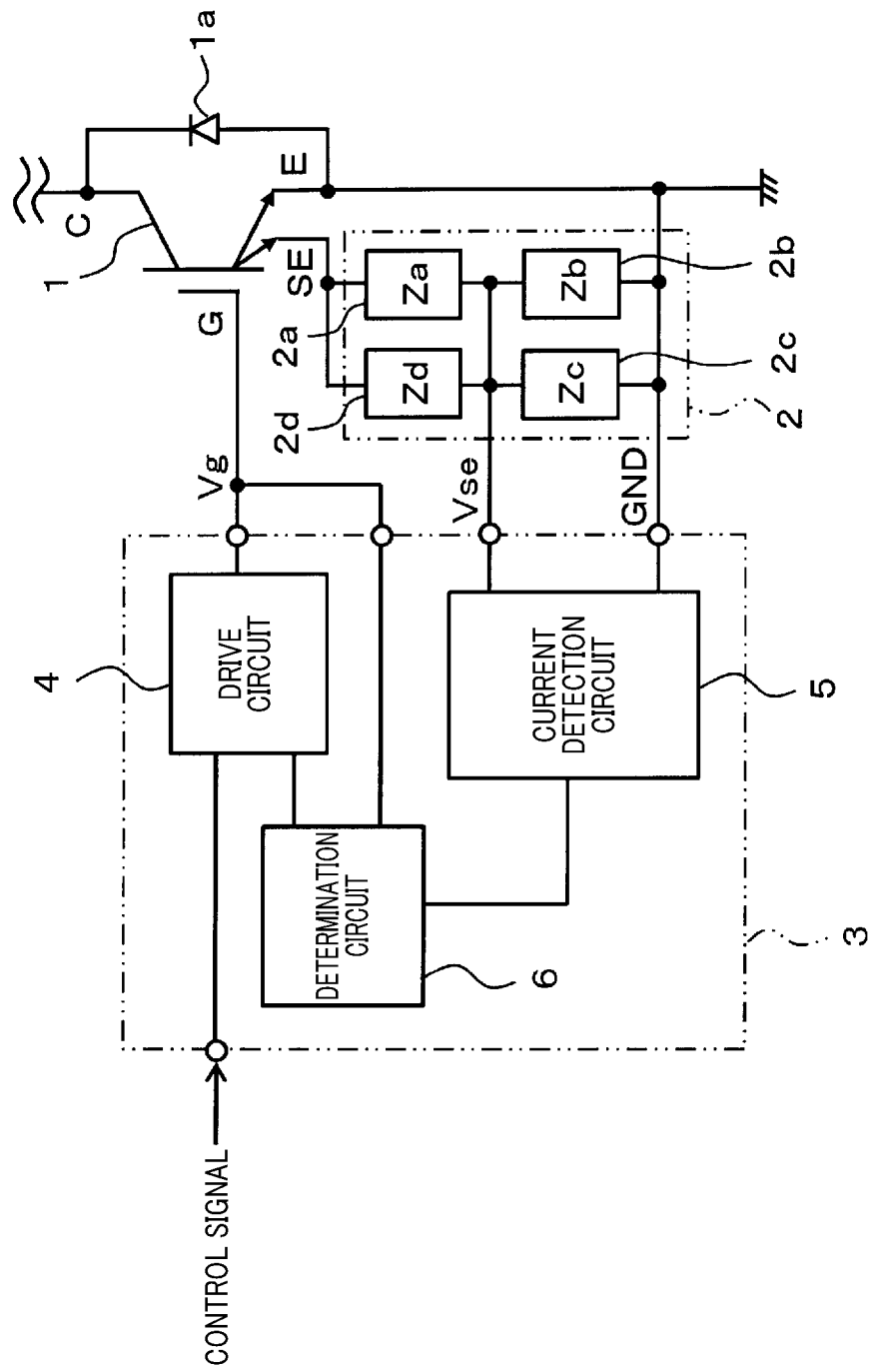
FIG. 1 is an electrical configuration diagram of a basic configuration showing a first embodiment.

In FIG. 1 that shows a basic configuration of the first system, the IGBT 1 integrally includes a main element and a sense element and the main element and the sense element are connected with collectors C and gates G in common. With respect to an emitter E of the main element, the sense element has a sense emitter SE provided to detect a current proportional to a current flowing in the main element. In addition, in the IGBT 1, a diode 1a is connected between the collector C and the emitter E. The diode 1a may be incorporated in the IGBT 1 or provided externally.

In the IGBT 1, the collector C to emitter E is connected between a load, not shown, and the ground. The sense emitter SE is connected to the ground via an impedance circuit 2 for current detection. The impedance circuit 2 has first to fourth impedances 2a to 2d. A series circuit of the first and second impedances 2a and 2b is connected between the sense emitter SE and a ground terminal, the third impedance 2c is connected in parallel with the second impedance 2b, and the fourth impedance 2d is connected in parallel with the first impedance 2a.

A current of the sense element of the IGBT 1 is detected from a terminal voltage of the second impedance 2b. Each of the first to fourth impedances 2a to 2d is configured by an element selected from a resistor for current detection, a capacitor for absorbing characteristics of transient variation, a switch, and the like. In addition, the first to fourth impedances 2a to 2d are set, as impedance values, to Za, Zb, Zc, and Zd, respectively.

A control circuit 3 includes a drive circuit 4 that supplies a gate signal to the gate G of the IGBT 1, a current detection circuit 5 that detects a current of the IGBT 1, a determination circuit 6 that determines an overcurrent or a short-circuit state, and the like. The drive circuit 4 supplies a gate voltage suitable for driving the IGBT 1, based on a drive signal provided from the outside. The current detection circuit 5 takes in a terminal voltage of the second impedance 2b of the impedance circuit 2 to detect a current value of the sense element, and thereby detects the current of the main element of the IGBT 1.

The determination circuit 6, in a case where the current of the IGBT 1 detected by the current detection circuit 4 is in a level of overcurrent or short-circuit, determines it as an abnormal state and stops the operation of the drive circuit 4. In this case, the determination circuit 6 is configured to take in a gate voltage Vg in advance and change the determination level in accordance with a value of the gate voltage Vg. The determination circuit 6 functions as a transient characteristic absorbing circuit in this embodiment.

In a gate-drive type semiconductor switching element, when a drive signal is applied to a gate to turn on the switching element, generally a mirror period exists and the gate voltage does not rise during this period. This corresponds to a time for charging mirror capacitance, and the gate voltage cannot be increased to a predetermined voltage until the mirror period elapses.

Figure 5:
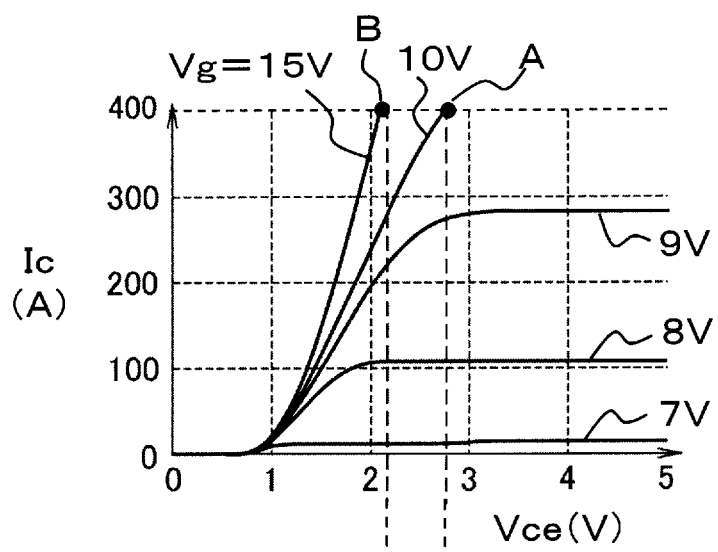
FIG. 5 is a voltage/current characteristic diagram of a main element and a sense element of a switching element.
Figure 5:
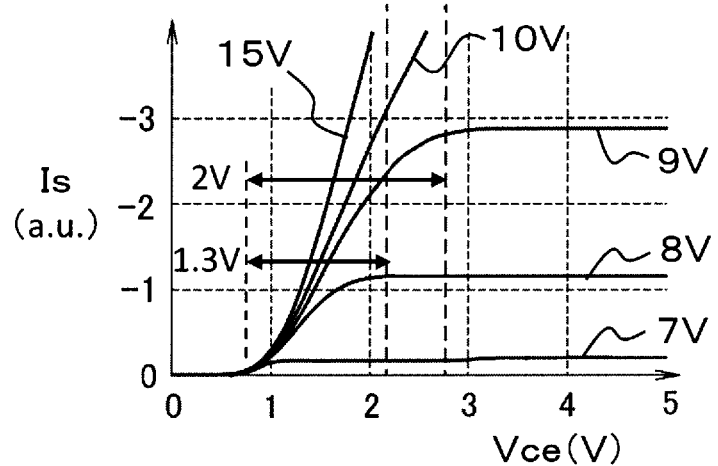

When a rated current is made to flow in the IGBT 1, a collector-emitter voltage Vce changes as shown with A-point and B-point in the upper side of FIG. 5 due to a change between a gate voltage Vg applied during the mirror period and a gate voltage Vg applied after the mirror period has elapsed. The voltage Vse appearing at the sense emitter SE at this time increases during the mirror period and decreases after the mirror period has elapsed.

Along with this, the sense voltage Vse, as shown in the lower side of FIG. 5, becomes about 2 V when the gate voltage Vg is 10 V in the figure with respect to Vce, and becomes about 1.3 V when the gate voltage Vg is 15 V. As shown in a time chart in FIG. 4, when the gate voltage Vg remains about 10 V during the mirror period, the sense voltage Vse becomes near 2 V, and thereafter when the mirror period finished, the sense voltage Vse decreases to about 1.3 V.

In this embodiment, even when the sense voltage Vse thus detected during the mirror period is higher than the sense voltage Vse after the mirror period elapsed, in accordance with the condition, it is determined whether the state is an abnormal state, such as an overcurrent state or a short-circuit state. Hence, for example, in a case where the gate voltage Vg during the mirror period is 10 V and the gate voltage Vg after the mirror period is 15 V, a switching voltage Vg1 is set to 12 V or the like.

Figure 3:
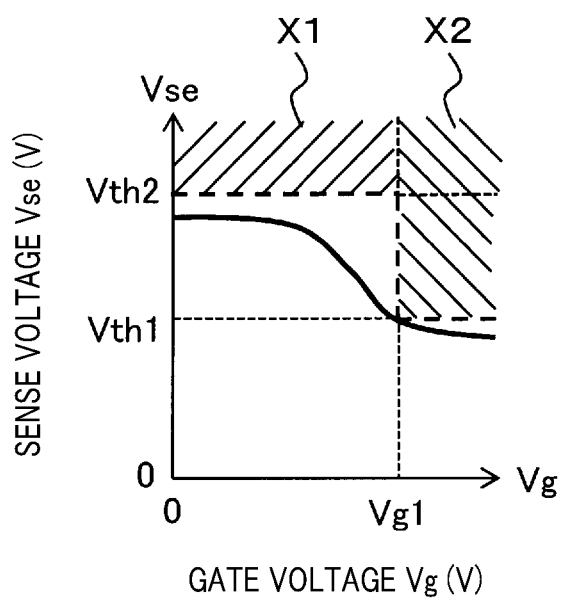
FIG. 3 is an explanatory diagram of threshold voltage switching of sense voltage.
Figure 4:
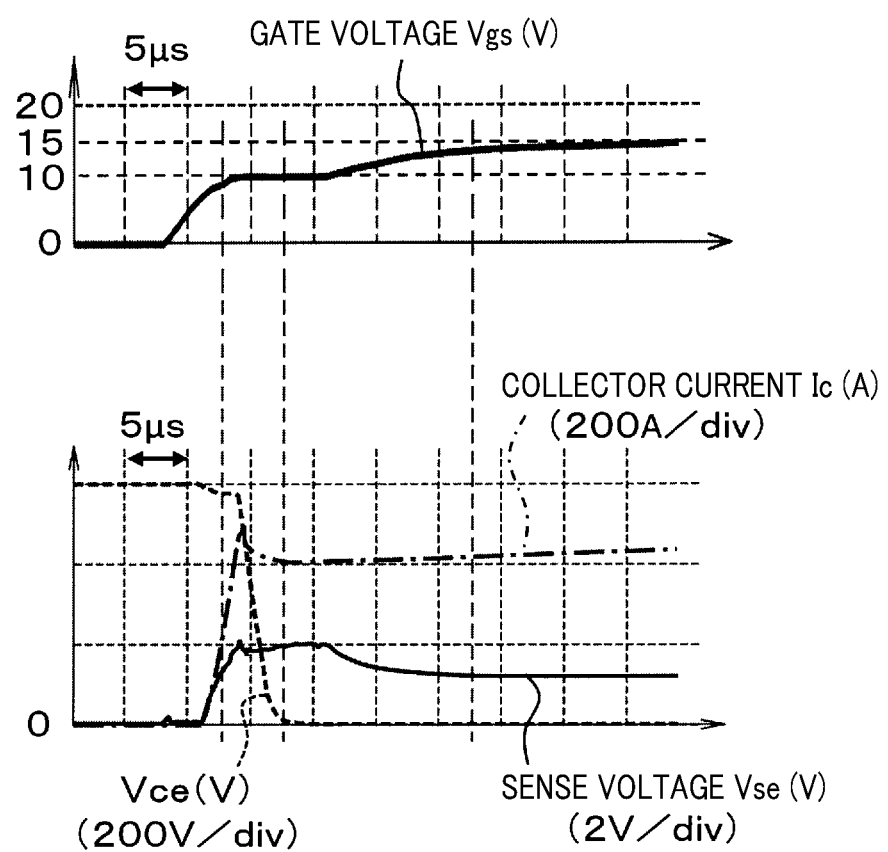
FIG. 4 is a time chart of signals of respective parts.

As shown in FIG. 3, in the determination circuit 6, in a case where the operation state of the IGBT 1 is in the mirror period and the gate voltage Vg is less than Vg1 (=12 V), a threshold voltage for determining an overcurrent or a short-circuit state from the sense voltage Vse is set to Vth2. In addition, in a case where the operation state of the IGBT 1 after the mirror period has elapsed is a normal state and the gate voltage Vg is not more than the switching voltage Vg1 (=12 V), the threshold voltage for determining an overcurrent or a short-circuit state from the sense voltage Vse is set to Vth1, which is a voltage lower than the threshold voltage Vth2.

In FIG. 3, in a case where the sense voltage Vse takes a value in a shaded region in the figure in accordance with a value of the gate voltage Vg, the state is determined to be an abnormal state of overcurrent or short-circuit. With this, even in a case where the operation state of the IGBT 1 is a transient state, which is the mirror period of the gate, the threshold voltage Vth2 allows the determination from the sense voltage Vse to be performed.

Figure 2:
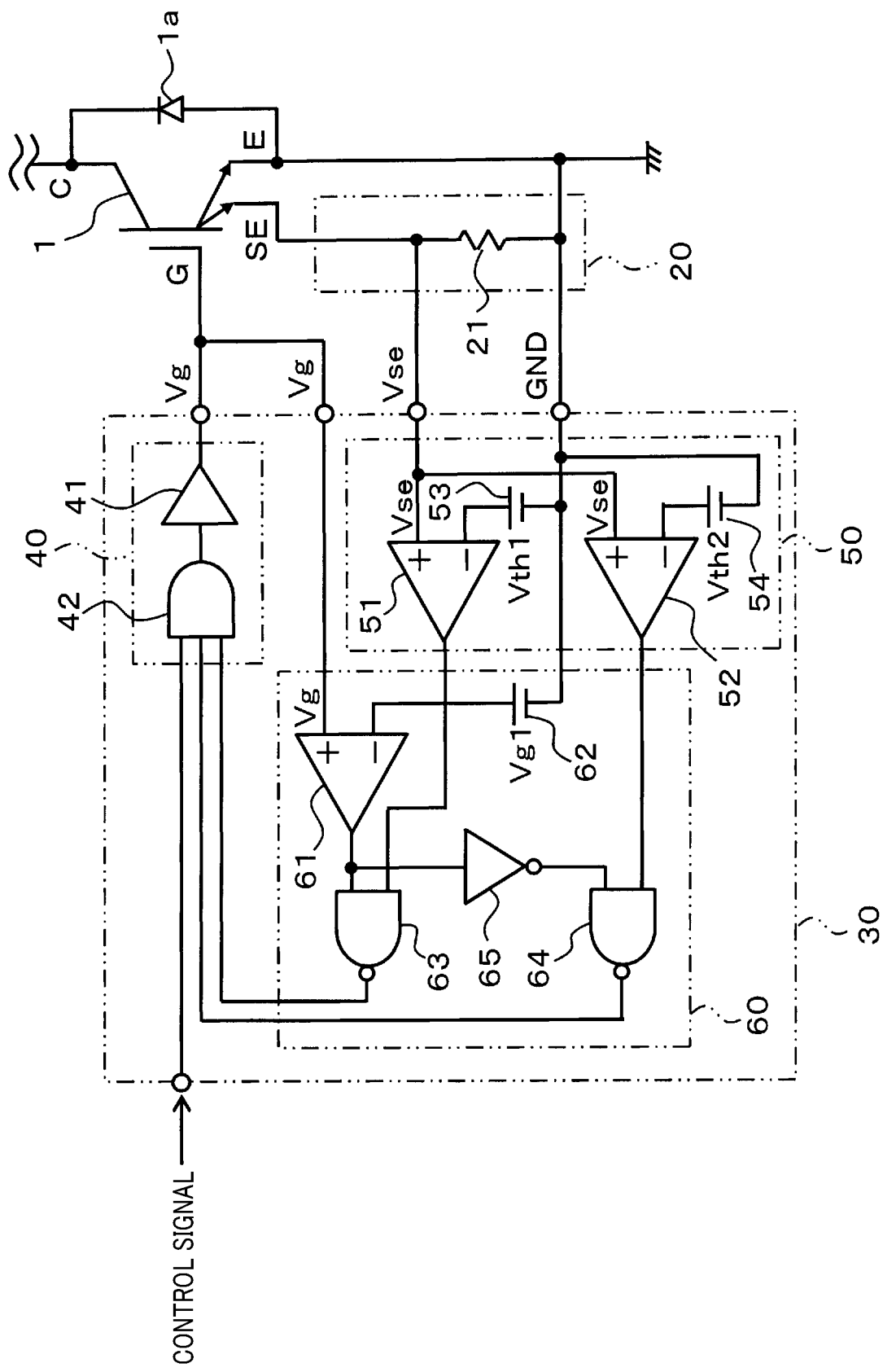
FIG. 2 is a specific electrical configuration diagram.

FIG. 2 is a circuit diagram showing one example of a case where the above-described circuit of FIG. 1 is implemented with a specific circuit, and a configuration thereof will be described below. In an impedance circuit 20, a current detection resistor 21 connected between the sense emitter SE and the ground is provided as a sense resistor. If the impedance circuit 20 is associated with the impedance circuit 2 shown in FIG. 1, the current detection resistor 21 corresponds to the second impedance 2b, and the impedance Zb is a resistance value. In addition, the first impedance 2a in the impedance part 2 shown in FIG. 1 is set to a state in which the impedance Za corresponds to a zero-resistance value, that is, a short-circuit state. The third impedance 2c is set to a state in which the impedance Zc corresponds to an infinite-resistance value, that is, an open state. In addition, since the first impedance 2a is in the short-circuit state, the fourth impedance 2d is disabled, and thus the impedance Zd may take any value.

A control circuit 30 includes a drive circuit 40 and also includes a current detection circuit 50 and a determination circuit 60. The drive circuit 40 includes a driver circuit 41 that applies a control signal received from the outside to the gate of the IGBT 1 as a gate voltage Vg and an AND circuit 42 for stopping the drive upon receiving a stop signal from the determination circuit 60. The control signal is input to the driver circuit 41 via an input/output terminal of the AND circuit 42. The AND circuit 42 includes three input terminals and the stop signal is input from the determination circuit 60 to the remaining two input terminals. The gate voltage Vg output from the driver circuit 41 is also input to the determination circuit 60.

The current detection circuit 50 includes a first comparator 51 and a second comparator 52 that detect a level of a sense voltage Vse appearing between terminals of the current detection resistor 21. The first comparator 51 outputs a high-level detection signal when a level of the sense voltage Vse is larger than a threshold voltage Vth1 that is set by a reference power supply 53 in comparison. After the mirror period has elapsed, by using the threshold voltage Vth1, it is detected that a collector current Ic detected from the sense voltage Vse is in an overcurrent state or a short-circuit state.

The second comparator 52 outputs a high-level detection signal when a level of the sense voltage Vse is larger than a threshold voltage Vth2 that is set by a reference power supply 54 in comparison. The threshold voltage Vth2 is set to a voltage larger than the threshold voltage Vth1 and detects that a collector current Ic detected by the sense voltage Vse during the mirror period is in an overcurrent state or a short-circuit state. The threshold voltages Vth1, Vth2 are set according to the relation shown in FIG. 3.

In the determination circuit 60, a third comparator 61 determines a level of the gate voltage Vg and a switching voltage Vg1 serving as a determination level is supplied from a reference power supply 62. The third comparator 61 outputs a high-level signal in a state in which the gate voltage Vg exceeds the switching voltage Vg1. A NAND circuit 63 has two input terminals connected to output terminals of the first comparator 51 and the third comparator 61, respectively, and an output terminal connected to the input terminal of the AND circuit 42. A NAND circuit 64 has one input terminal connected to an output terminal of the second comparator 51 and the other input terminal connected to the output terminal of the third comparator 61 via an inverter circuit 65. An output terminal of the NAND circuit 64 is connected to the input terminal of the AND circuit 42.

With the above configuration, when a control signal is provided from the outside and the gate voltage Vg is applied from the drive circuit 40 to the gate G of the IGBT 1, the IGBT 1 is turned on. At this time, in the IGBT 1, the gate voltage Vg increases, and is kept in a voltage lower than a predetermined level during the mirror period. After the mirror period has elapsed, the gate voltage Vg increases to the predetermined level.

The first comparator 51 determines whether the sense voltage Vse accompanied by the operation of the IGBT 1 exceeds the threshold voltage Vth1. The second comparator 52 determines whether the sense voltage Vse exceeds the threshold voltage Vth2. In the determination circuit 60, since when the gate voltage Vg is low, that is, during the mirror period in the operation of the IGBT 1, the third comparator 61 outputs a low-level signal, a high-level signal is input to the NAND circuit 64 via the inverter circuit 65.

Hence, during the mirror period, an overcurrent or a short-circuit state is generated when the sense voltage Vse exceeds the threshold voltage Vth2 that is set high, and then the NAND circuit 64 inputs a low-level signal to the AND circuit 42. Thus, the drive circuit 40 stops the application of the gate voltage Vg to the gate G of the IGBT 1.

On the other hand, when the IGBT 1 gets out of the mirror period and the gate voltage Vg exceeds the switching voltage Vg1, in the determination circuit 60, the third comparator 61 outputs a high-level signal, and thus the high-level signal is input to the NAND circuit 63. Therefore, after the mirror period has elapsed, an overcurrent or a short-circuit state is generated when the sense voltage Vse exceeds a normal threshold voltage Vth1, and then the NAND circuit 63 inputs a low-level signal to the AND circuit 42. Thus, the drive circuit 40 stops the application of the gate voltage Vg to the gate G of the IGBT 1.

In addition, in the case other than the above, any of the inputs of the two NAND circuit 63, 64 is a low level or the two inputs are low levels and thus the both circuits output high-level signals, the AND circuit 42 of the drive circuit 40 generates the gate voltage Vg in accordance with the level of the control signal.

Consequently, during an on-operation of the IGBT 1, even in a case where the gate voltage Vg is in the mirror period and remains at a low-voltage level, generation of the abnormal state of the overcurrent or short-circuit can be rapidly detected, and this makes it possible to perform the protection operation of stopping the drive circuit 40. As a result, the time during which the overcurrent continues to flow when the IGBT 1 is abnormal can be limited to as short a time as possible, and thus it is possible to reliably perform the protection operation without increasing the current capacity.

Second Embodiment

Figure 6:
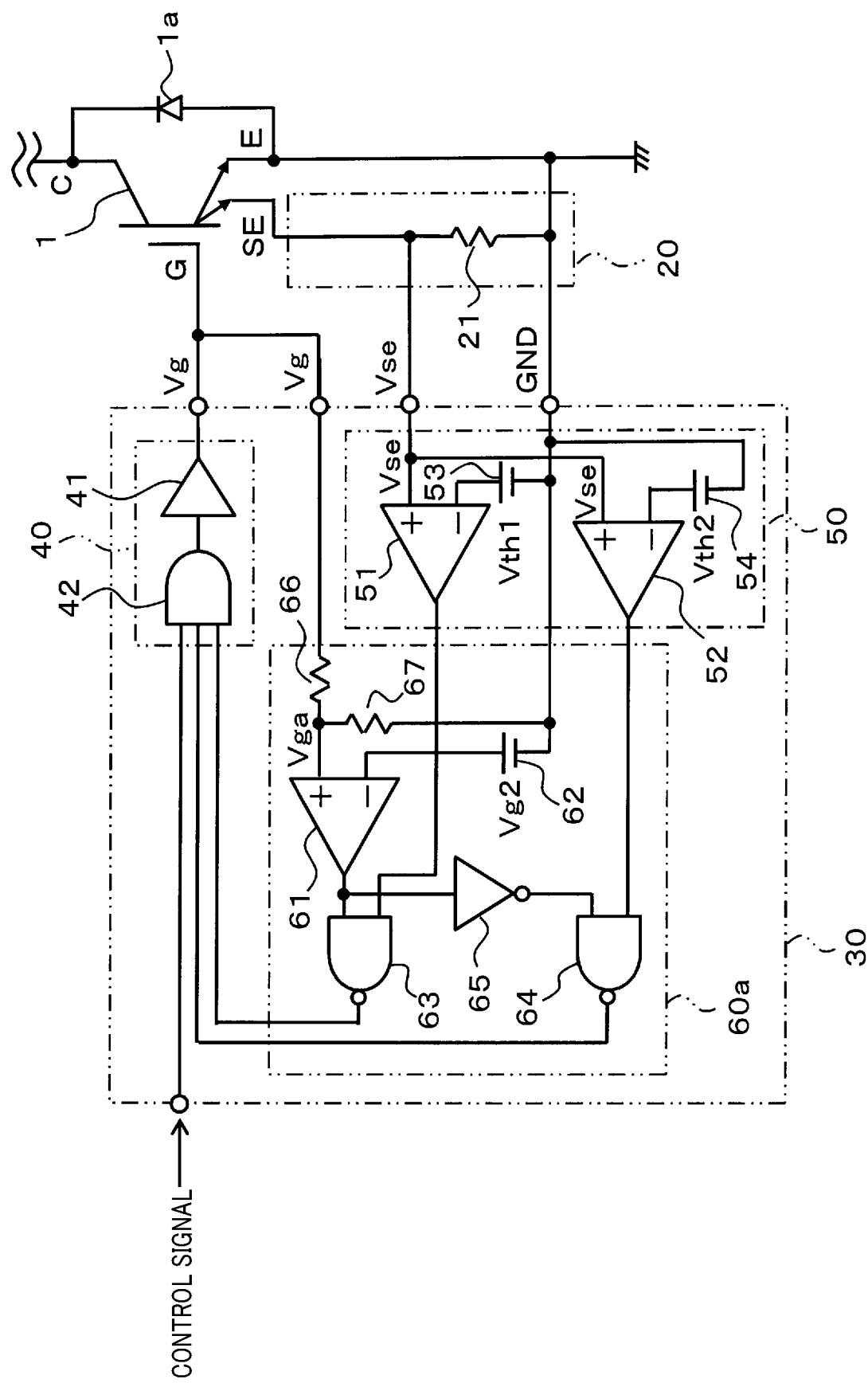
FIG. 6 is an electrical configuration diagram showing a second embodiment.

FIG. 6 shows the second embodiment and hereinafter illustrates parts different from the first embodiment. In this embodiment, as a configuration to detect the gate voltage Vg of the IGBT 1, as shown in FIG. 6, provided is a determination circuit 60a using a voltage dividing circuit of resistors 66 and 67. In the configuration, a series circuit of the resistors 66, 67 is connected between the gate G and the ground, and the common connection point thereof is input to the third comparator 61 of the determination circuit 60a.

The gate voltage Vg is divided by the resistors 66, 67 and is input to the third comparator 61 as a voltage Vga proportional to the gate voltage Vg. In accordance with this configuration, the reference power supply 62 sets Vg2 instead of the switching voltage Vg1.

Hence, also with the second embodiment described above, effects similar to those of the first embodiment can be obtained. In addition, since the gate voltage Vg is divided by the resistors 66, 67, even in a case where the gate voltage Vg that drives the IGBT 1 is high, the third comparator 61 adapted to the low voltage can be used in the determination circuit 60a.

Third Embodiment

Figure 7:
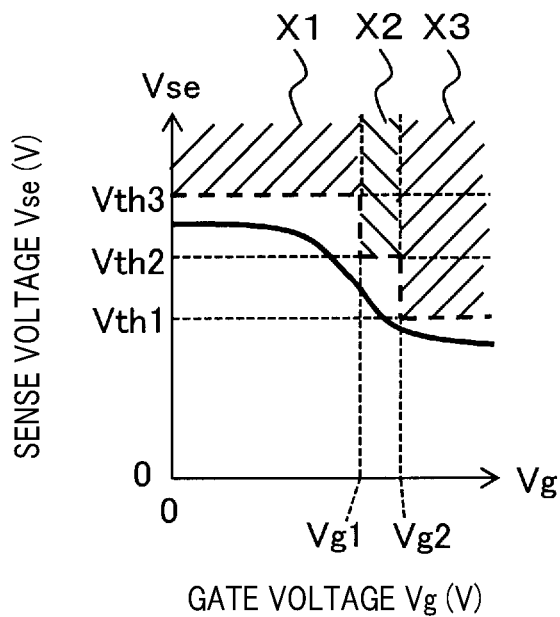
FIG. 7 is an explanatory diagram of threshold voltage switching of sense voltage showing a third embodiment.

FIG. 7 shows the third embodiment, which is different from the first embodiment in that a region of the gate voltage Vg is divided into three regions by Vg1 and Vg2, and in the respective three regions, threshold voltages Vth1, Vth2, and Vth3 of the sense voltage Vse are set.

As shown in FIG. 7, accuracy in detecting an abnormality is enhanced by finer setting of the threshold voltage in consideration of the relation between the gate voltage Vg and a standard sense voltage Vse. In this case, the conditions that the value of the sense voltage Vse indicates an overcurrent or a short-circuit abnormality are the following expressions (a) to (c) depending on the value of the gate voltage Vg. These are conditions for cases corresponding to regions indicated by hatched lines in FIG. 7. In the determination circuit 60, it can be configured so that three comparators are provided and are switched depending on the gate voltage Vg.

$$\text{When } Vg \geq Vg1, Vse > Vth3 \quad (a)$$

$$\text{when } Vg1 \geq Vg \geq Vg2, Vse > Vth2 \quad (b), \text{ and}$$

$$\text{when } Vg2 \geq Vg, Vse > Vth1 \quad (c)$$

Also with the third embodiment described above, effects similar to those of the first embodiment can be obtained, and an overcurrent or a short-circuit abnormality can be detected more finely by the sense voltage Vse.

Note that, a configuration which divides the region into further finer regions depending on the gate voltage Vg and sets threshold voltages to the respective regions may also be adopted.

Fourth Embodiment

Figure 8:
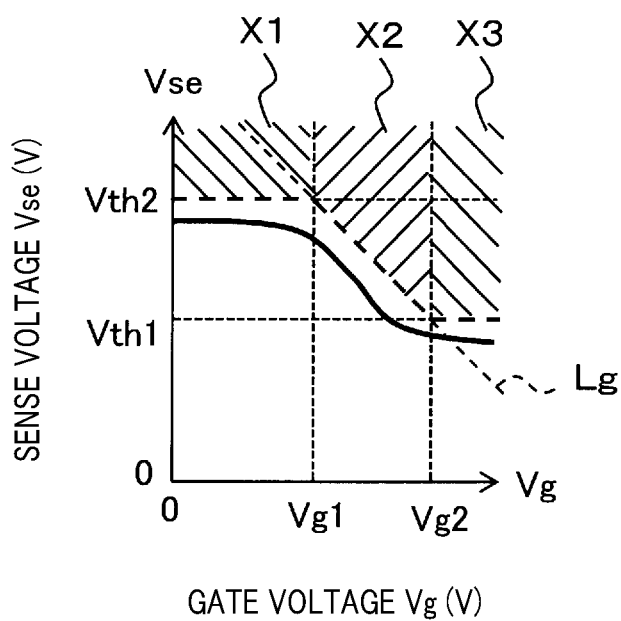
FIG. 8 is an explanatory diagram of threshold voltage switching of sense voltage showing a fourth embodiment.
Figure 9:
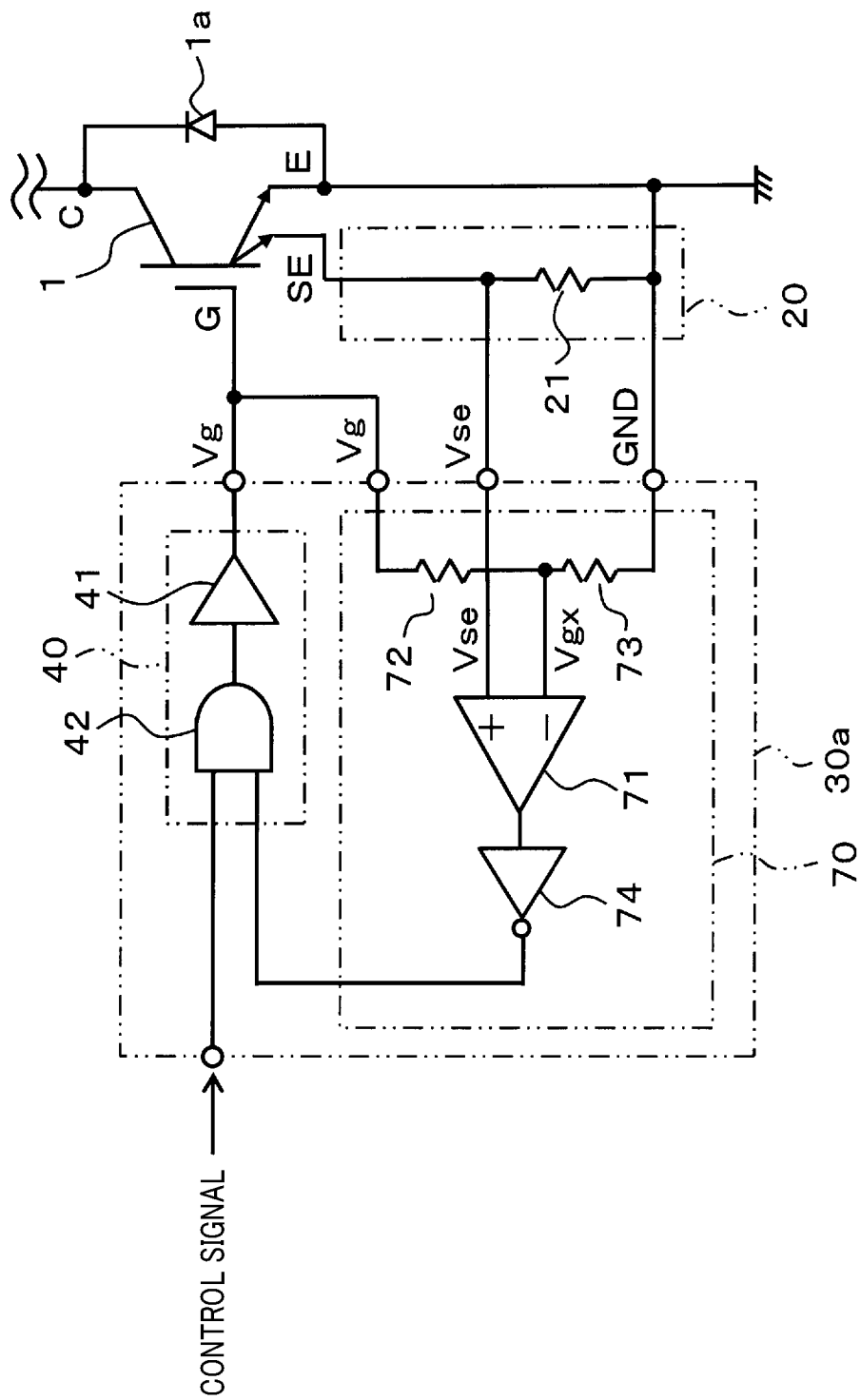
FIG. 9 is an electrical configuration diagram.

FIG. 8 and FIG. 9 show the fourth embodiment, which is different from the third embodiment in that the threshold voltage of the sense voltage Vse is set so as to continuously change depending on the gate voltage Vg.

As shown in FIG. 8, in consideration of the relation between the gate voltage Vg and the standard sense voltage Vse, an oblique line Lg is set in accordance with the slope of a part in which the sense voltage Vse changes along with the change of the gate voltage Vg and the threshold voltage Vth is set so as to continuously change along the oblique line Lg depending on the gate voltage Vg.

For example, in a part where the sense voltage Vse is flat with respect to the gate voltage Vg, in Vg<Vg1 and Vg 2≥Vg2, the threshold voltage is made constant, Vth2 and Vth1, respectively. Then, when the gate voltage Vg is between Vg1 and Vg2, the threshold voltage Vth can be changed along the oblique line Lg. The case corresponding to the region indicated by the hatched lines in FIG. 8 shows a region of the sense voltage Vse in which the state is an abnormal state of overcurrent or short-circuit.

Also with the fourth embodiment described above, effects similar to those of the third embodiment can be obtained, and an overcurrent or a short-circuit abnormality can be detected more finely from the sense voltage Vse.

Note that, as to the configuration of the above embodiment, FIG. 9 shows a configuration that continuously changes the threshold voltage Vth in accordance with the slope of the part in which the sense voltage Vse changes along with the change of the gate voltage Vg.

A control circuit 30a includes the drive circuit 40 and also includes an overcurrent detection circuit 70 that includes both a current detection circuit and a determination circuit. In the overcurrent detection circuit 70, a fourth comparator 71 receives the sense voltage Vse at a non-inverting input terminal and receives a voltage Vgx obtained by dividing the gate voltage Vg at an inverting input terminal. The overcurrent detection circuit 70 is configured to apply the gate voltage Vg between terminals of a series circuit of resistors 72 and 73, and the divided voltage Vgx appearing at a common connection point is a voltage proportional to the gate voltage Vg.

The output terminal of the comparator 71 is connected to the input terminal of the AND circuit 42 of the drive circuit 40 via an inverter circuit 74. When the sense voltage Vse exceeds the divided voltage Vgx, the fourth comparator 71 outputs a high-level detection signal. This is a case where the IGBT 1 is in an overcurrent or a short-circuit state and corresponds to a portion indicated by the hatched region in FIG. 8. The drive circuit 40 receives the low-level signal at the AND circuit 42 via the inverter circuit 74, and thus performs the protection operation of stopping the gate voltage Vg of the IGBT 1 and shifting it to the off-state.

Note that, although not shown in FIG. 9, it becomes possible to rapidly and accurately determine the overcurrent or short-circuit state of the IGBT 1 under the condition shown in FIG. 8 by adding a circuit that sets the threshold voltage Vth2 when the gate voltage is Vg1 or less and the threshold voltage Vth1 when the gate voltage exceeds Vg2.

In addition, the setting of the threshold voltage in accordance with the gate voltage Vg is not limited to the method of linearly setting it but also can be appropriately changed following the change of the gate voltage Vg.

Fifth Embodiment

Figure 10:
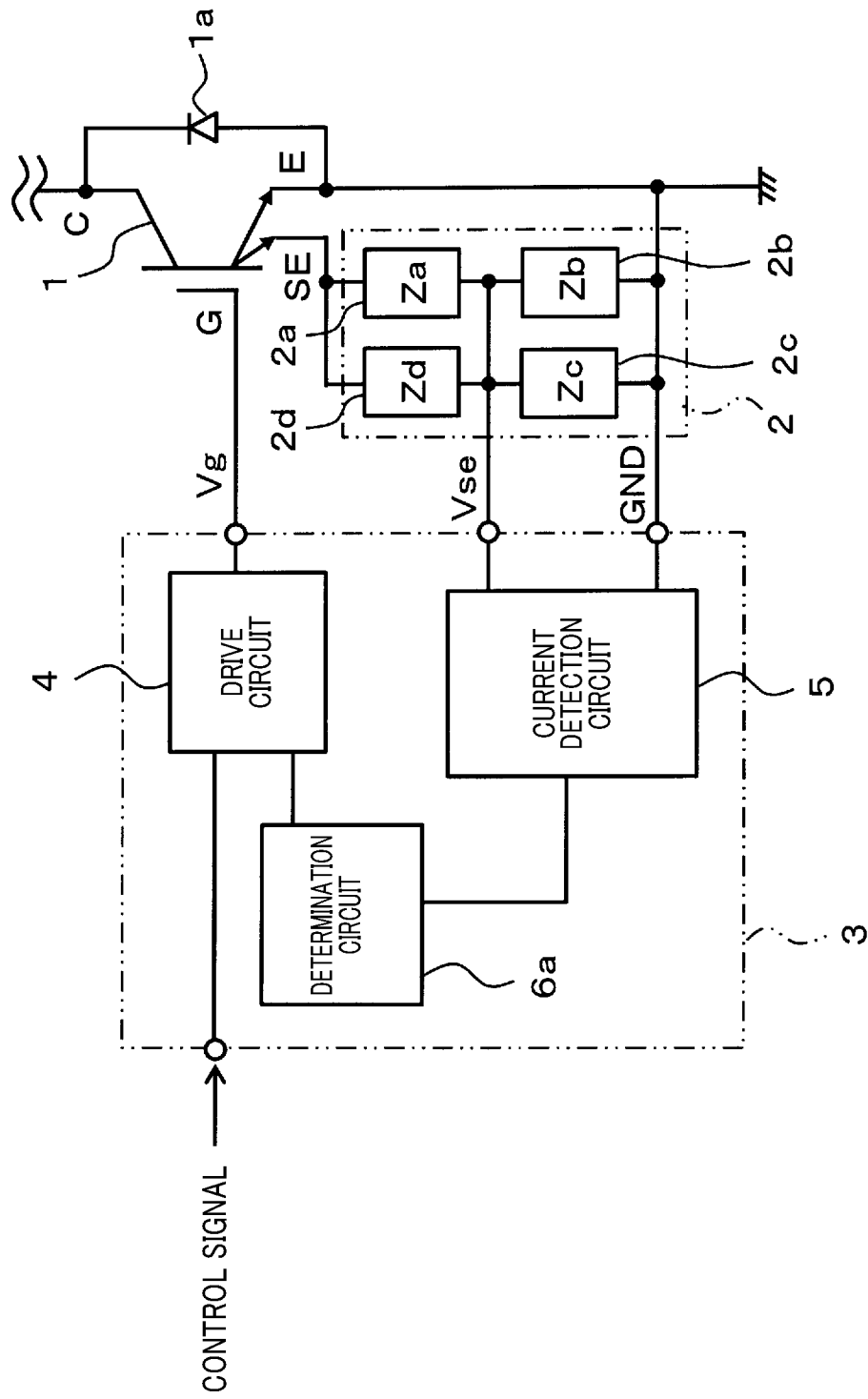
FIG. 10 is an electrical configuration diagram of a basic configuration showing a fifth embodiment.

FIG. 10 to FIG. 13 show the fifth embodiment, and parts different from the first embodiment will be described below. In the embodiment, as a second system that can rapidly detect an overcurrent or a short-circuit state of the IGBT 1 and perform the protection operation, a system not monitoring the gate voltage will be described. FIG. 10 shows a basic configuration of the second system. Note that, the basic configuration of FIG. 10 is also adapted to basic configurations of a third system and a fourth system described below.

In FIG. 10, the control circuit 3 includes a determination circuit 6a in place of the determination circuit 6. The determination circuit 6a has a configuration to which the gate voltage Vg is not input. In addition, the impedance circuit 2 is configured to function also as a transient characteristic absorbing circuit. The function of the transient characteristic absorbing circuit is achieved, for example, by the use of a capacitor as the third impedance 2c. In addition, a configuration in which the first impedance 2a is in a short-circuit state, and the second impedance 2b uses a resistor for current detection or has an infinite resistance, or the like is used. In addition, since the first impedance 2a is in the short-circuit state, the fourth impedance 2d is invalidated, and thus the impedance Zd may take any value.

Figure 11:
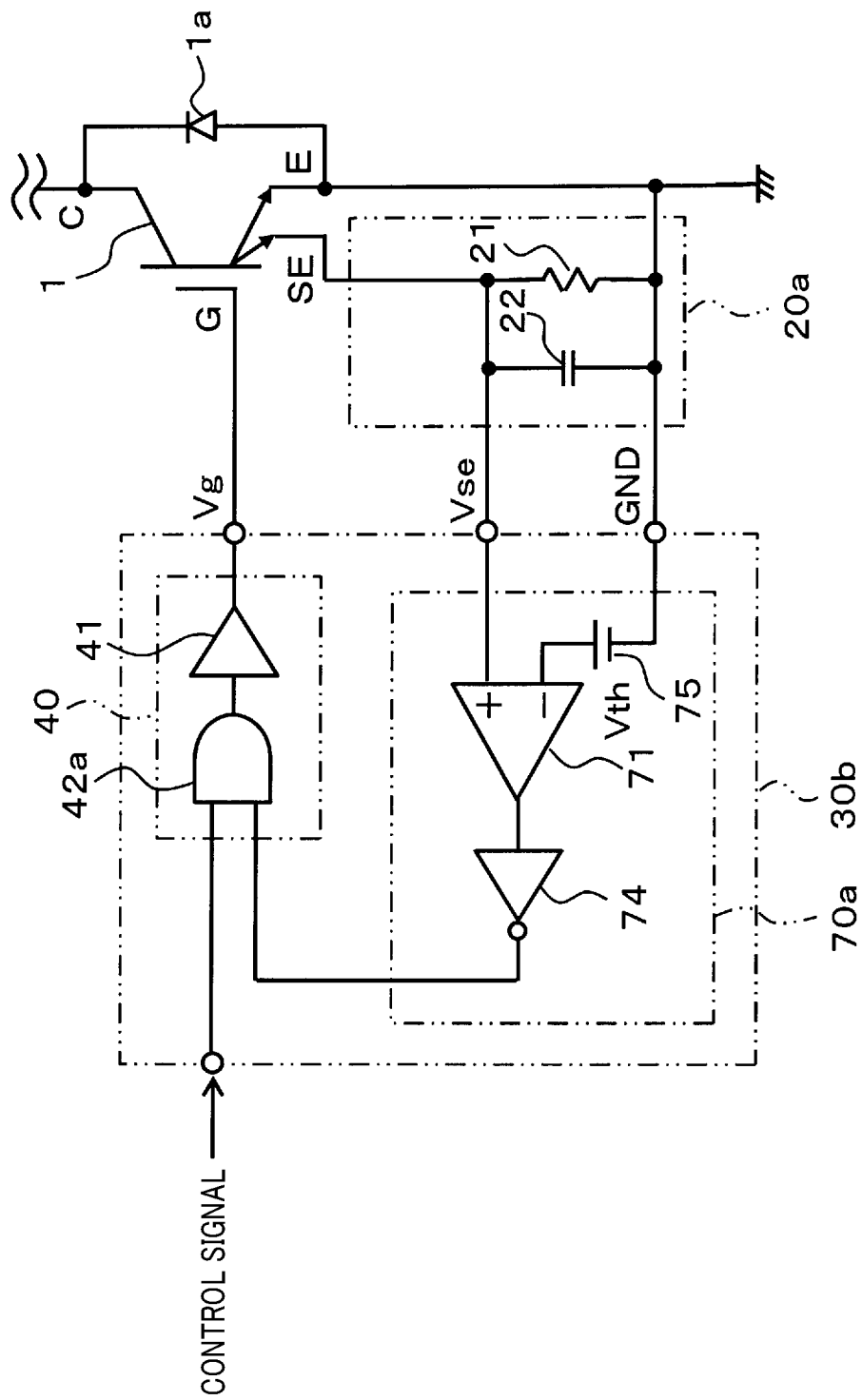
FIG. 11 is a specific electrical configuration diagram.

FIG. 11 is an example of a specific circuit configuration of the second system. An impedance circuit 20a is provided as a current detection resistor 21, which is a sense resistor connected between the sense emitter SE and the ground, and a capacitor 22. If the impedance circuit 20a is associated with the impedance circuit 2 shown in FIG. 10, the current detection resistor 21 corresponds to the second impedance 2b and the impedance Zb is a resistance value. The capacitor 22 corresponds to the third impedance 2c and the impedance Zc is a capacitance value. In addition, the first impedance 2a in the impedance part 2 shown in FIG. 10 is made into a state in which the impedance Za corresponds to zero-resistance, that is, a short-circuit state.

A control circuit 30b includes the drive circuit 40 and also includes an overcurrent detection circuit 70a that includes both a current detection circuit and a determination circuit. In the overcurrent detection circuit 70a, the fourth comparator 71 receives the sense voltage Vse at a non-inverting input terminal and receives the threshold voltage Vth set by a reference power supply 75 at an inverting input terminal, and outputs a high-level detection signal in a case where the level of the sense voltage Vse is larger than the threshold voltage Vth in comparison. The threshold voltage Vth is set so as to detect that the collector current Ic detected from the sense voltage Vse is in an overcurrent state or a short-circuit state.

The output terminal of the comparator 71 is connected to the input terminal of the AND circuit 42 of the drive circuit 40 via the inverter circuit 74. When the sense voltage Vse exceeds the threshold voltage Vth, the fourth comparator 71 outputs a high-level detection signal. This is a case where the IGBT 1 is in an overcurrent or a short-circuit state. Since the drive circuit 40 receives the low-level signal at the AND circuit 42 via the inverter circuit 74, the drive circuit 40 performs the protection operation of stopping the gate voltage Vg of the IGBT 1 and shifting it to the off-state.

Figure 12:
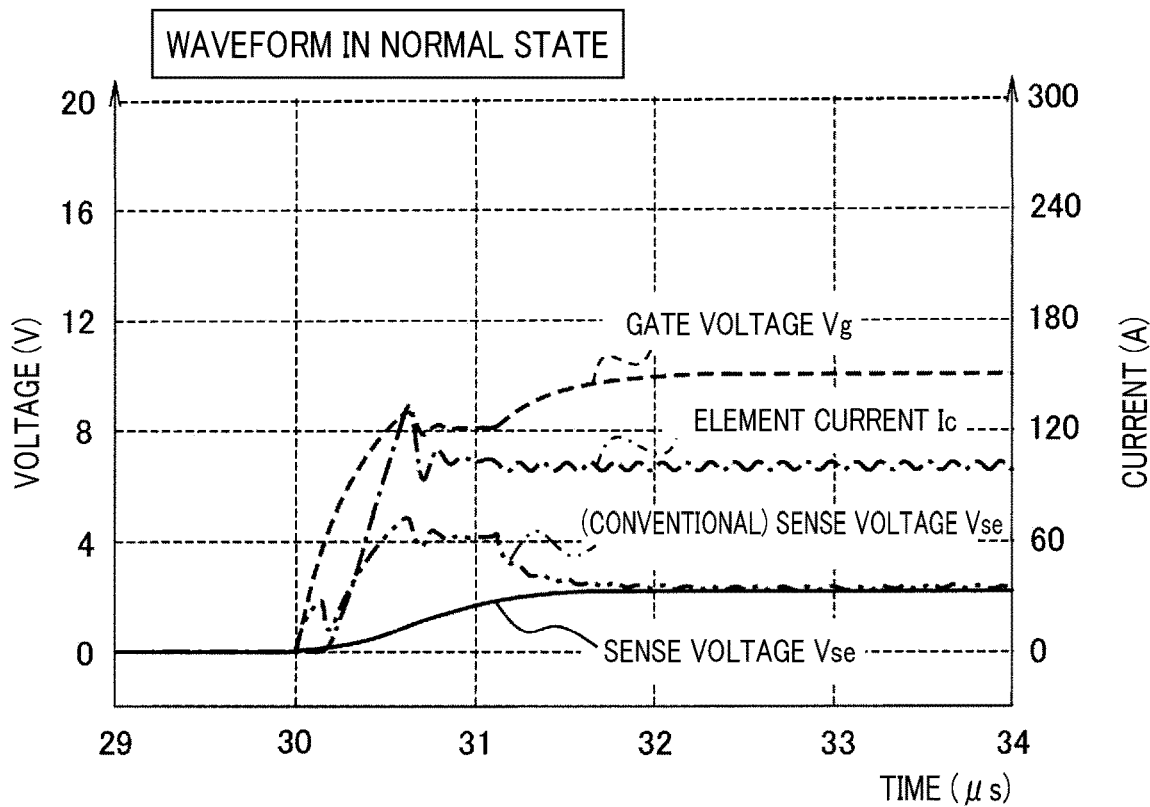
FIG. 12 is a time chart of signals of respective parts in a normal state.
Figure 13:
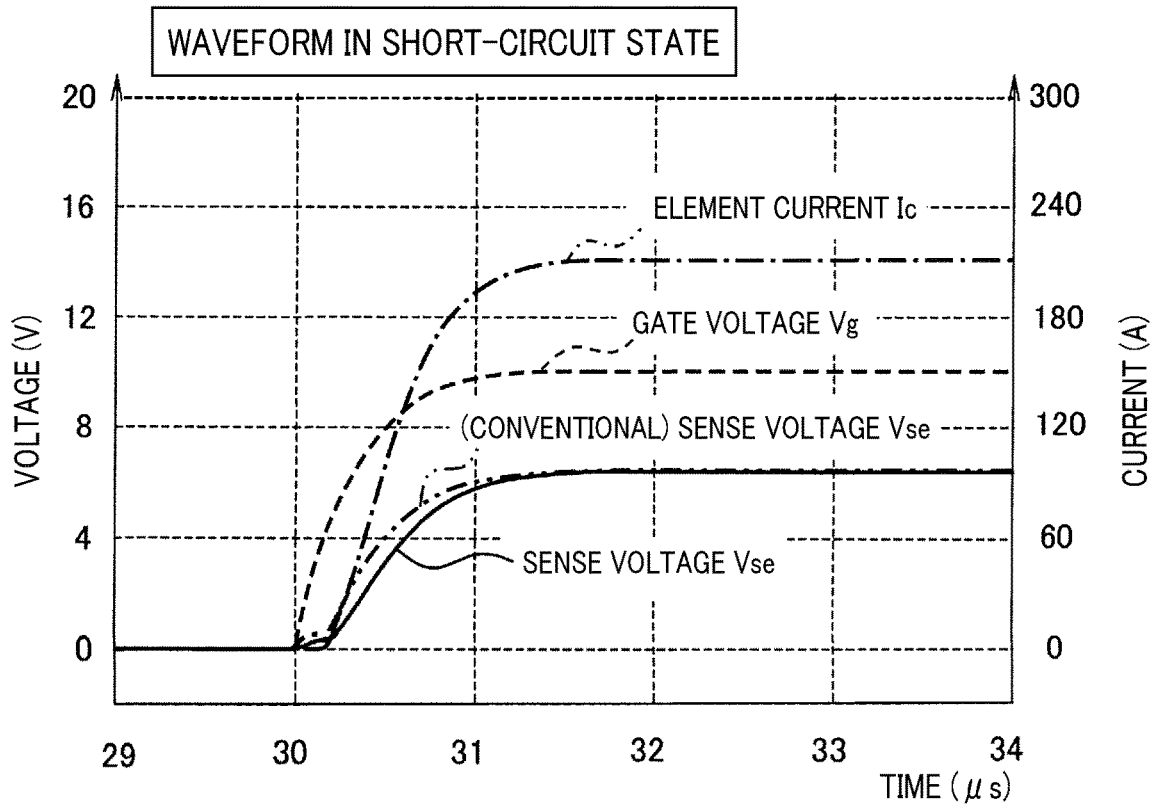
FIG. 13 is a time chart of signals of respective parts in a short-circuit state.

Next, operation of the above configuration will be described also with reference to FIG. 12 and FIG. 13. FIG. 12 and FIG. 13 show simulation results of time change of an element current Ic and a sense voltage Vse after application of a gate voltage Vg to the IGBT 1 in a normal state, that is, an ordinary state and a short-circuit state, respectively. In addition, for comparison, as for the sense voltage Vse, the waveforms in the configuration equivalent to the conventional one and those in the above-mentioned first to fourth embodiments are also shown.

In the above configuration, the IGBT 1 is turned on when a control signal is supplied from the outside and the gate voltage Vg is applied from the drive circuit 40 to the gate G of the IBGT 1. At this time, in the IGBT 1, as shown in FIG. 12, the gate voltage Vg increases, and is kept in a voltage lower than a predetermined level during the mirror period. After the mirror period has elapsed, the gate voltage Vg increases to the predetermined level.

In addition, the element current Ic transiently overshoots when the gate voltage Vg rises and then settles to a fixed level. The sense voltage Vse, in the conventional configuration, as shown in FIG. 12, has a small peak at the rise of the gate voltage Vg, then becomes a high voltage during the mirror period, and decreases somewhat to become a fixed level after the mirror period has elapsed.

In contrast, in this embodiment, the sense voltage Vse, as shown in the figure, gradually increases in a state in which the transient variation is absorbed, without exhibiting a peak value or becoming a high voltage during the mirror period. This is because the transient variation amount is absorbed by the capacitor 22 of the impedance circuit 20a and the sense voltage Vse is obtained as a terminal voltage along with charging of the capacitor 22.

On the other hand, in a state in which the IGBT 1 is short-circuited, as shown in FIG. 13, the element current Ic significantly increases beyond a predetermined level. Further, the gate voltage Vg also increases without going through the mirror period. In this case, even with the conventional system and the system of the present embodiment, the sense voltages Vse increase without going through the mirror period and thus provide similar waveforms.

Thus, the sense voltage Vse changes, however, with the conventional system, the detection operation is performed after the mirror period, which is from the application of the gate voltage Vg until completion of the transient variation, has elapsed, and thus the detection operation shown in the figure requires, for example, several microseconds. In contrast, with the system of the present embodiment, since the transient variation component does not exist even in the normal state or the short-circuit state, the detection operation can be performed in a short period. The time required for the detection operation shown in the figure can be shortened, for example, to about one-tenth of that of the conventional system.

Consequently, during the normal operation and during the on-operation of the IGBT 1, even in a case where the gate voltage Vg is in the mirror period and remains at a low-voltage level, whether the abnormal state of the overcurrent or short-circuit has been generated can be rapidly determined, and this makes it possible to perform the protection operation of stopping the drive circuit 40. The time during which the overcurrent continues to flow when the IGBT 1 is abnormal can be limited to as short a time as possible, and thus it is possible to reliably perform the protection operation without increasing the current capacity.

Note that, although the capacitor 22 is charged when the IGBT 1 is in an on-state, if the application of the gate voltage Vg is stopped to turn off the IGBT 1, the charging is stopped and the stored electric charge is discharged through the current detection resistor 21, and thus the terminal voltage becomes zero with the passage of time.

Sixth Embodiment

Figure 14:
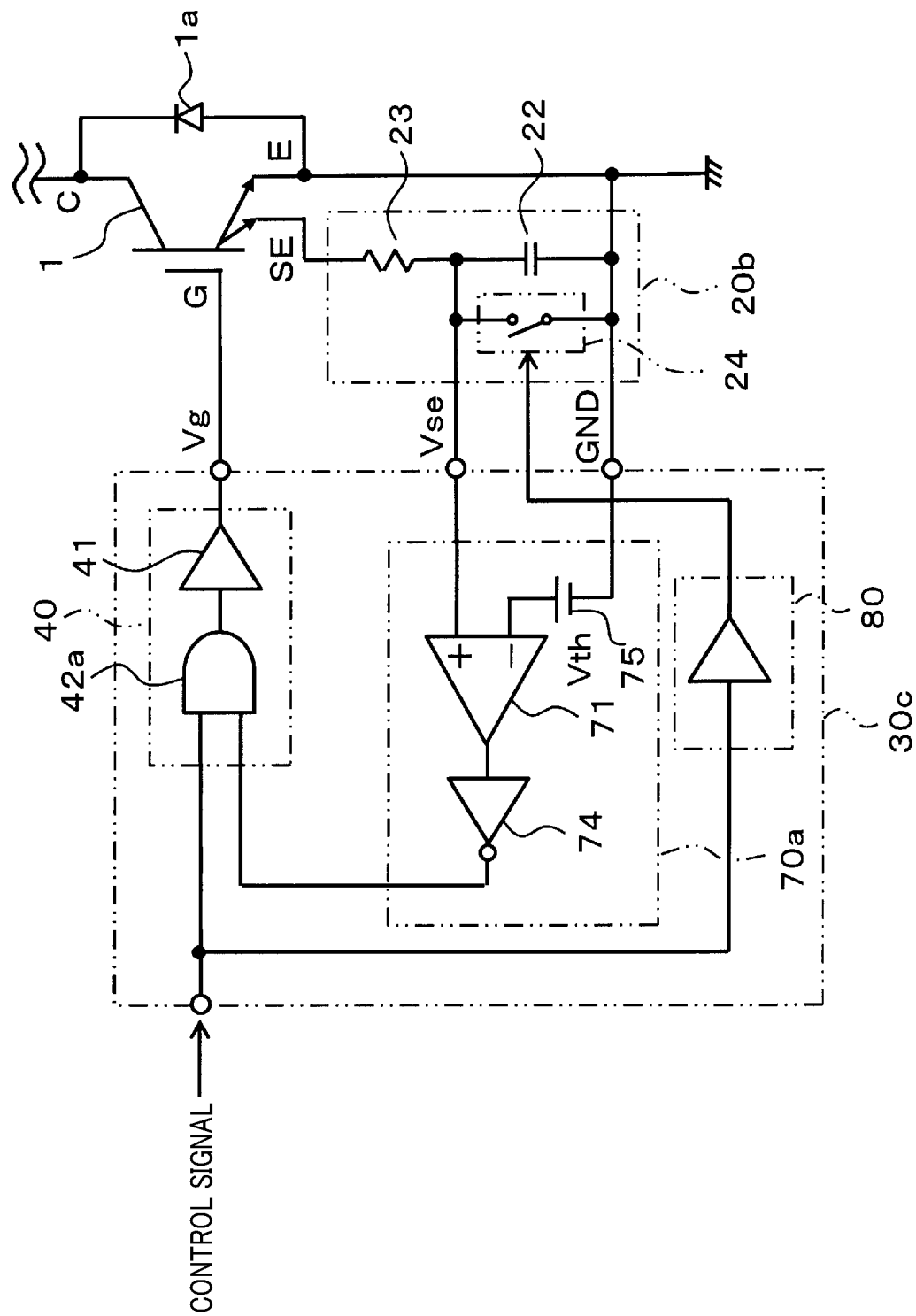
FIG. 14 is a specific electrical configuration diagram showing a sixth embodiment.
Figure 15:
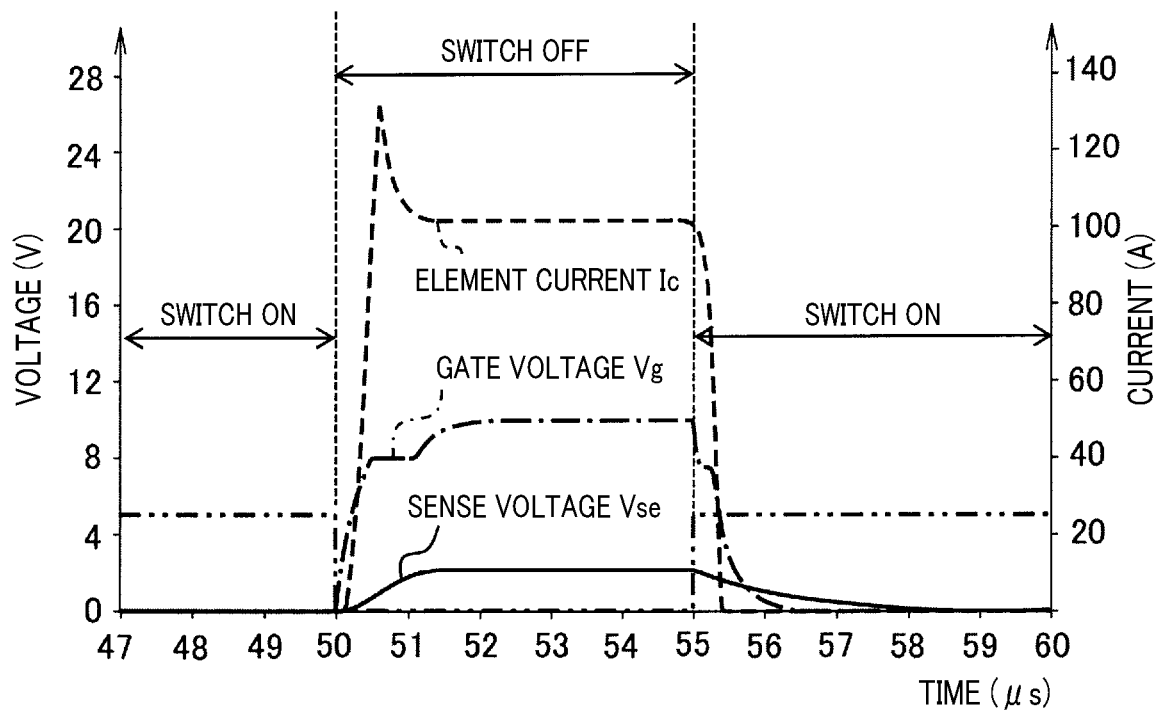
FIG. 15 is a time chart of signals of respective parts.

FIG. 14 and FIG. 15 show the sixth embodiment, and parts different from the fifth embodiment will be described below. This embodiment is adapted to a specific configuration of the third system with the basic configuration shown in FIG. 10. As shown in FIG. 14, an impedance circuit 20*b* is configured by the first impedance that is a resistor 23 as a sense resistor, the second impedance that is a capacitor 22, and the third impedance that is a switch 24 as a discharge switch, and the fourth impedance is set to an open state.

A control circuit 30*c* includes a switch control circuit 80 that controls the switch 24. The switch control circuit 80 controls on/off states of the switch 24 by a control signal input from the outside. In this case, the switch control circuit 80, when a control signal that turns on the IGBT 1 is input, controls the switch 24 into the off-state, and, when a control signal that turns off the IGBT 1 is input, controls the switch 24 into the on-state. Note that, in the impedance circuit 20*b*, during the period until a control signal is provided, the switch 24 is in an on-state, and thus the electric charge of the capacitor 22 is discharged and the voltage between the terminals is zero.

With the above configuration, similarly to the fifth embodiment, when a control signal is provided from the outside and the gate voltage Vg is applied from the drive circuit 40 to the gate G of the IGBT 1, the IGBT 1 is turned on. In addition, by the control signal, the switch 24 is provided with a signal of off-operation from the switch control circuit 80 and thus becomes an open state. In the IGBT 1, as shown in FIG. 15, the gate voltage Vg increases, and is kept in a voltage lower than a predetermined level during the mirror period. After the mirror period has elapsed, the gate voltage Vg increases to the predetermined level.

The element current Ic transiently overshoots when the gate voltage Vg rises and then settles to a fixed level. Here, at the sense terminal SE, a voltage equivalent to the sense voltage Vse equivalent to the conventional one shown in FIG. 12 and FIG. 13 appears. Then, the sense voltage Vse in this embodiment, similarly to the fifth embodiment, gradually increases in a state in which the transient variation is absorbed, without exhibiting a peak value and becoming a high voltage during the mirror period. This is because the transient variation amount is absorbed by the capacitor 22 of the impedance circuit 20*b* and the sense voltage Vse is obtained as the terminal voltage along with charging of the capacitor 22.

On the other hand, in a state in which the IGBT 1 is short-circuited, as shown in FIG. 13 described above, the element current Ic significantly increases beyond a predetermined level. Further, the gate voltage Vg also increases without going through the mirror period. In this case, with both the conventional system and the system of the present embodiment, the sense voltages Vse increase without going through the mirror period and thus provide similar waveforms.

Hence, similarly to the fifth embodiment, also in the system of the present embodiment, the transient variation component can be reduced in both the normal state and the short-circuit state and the detection operation can be performed in a short period. Consequently, effects similar to those of the fifth embodiment can be obtained.

Note that, in this embodiment, when the IGBT 1 is turned off, it is possible to instantly discharge the electric charge of the capacitor 22 by turning on the switch 24 by the switch control circuit 80, and thus the responsiveness can be improved.

Seventh Embodiment

Figure 16:
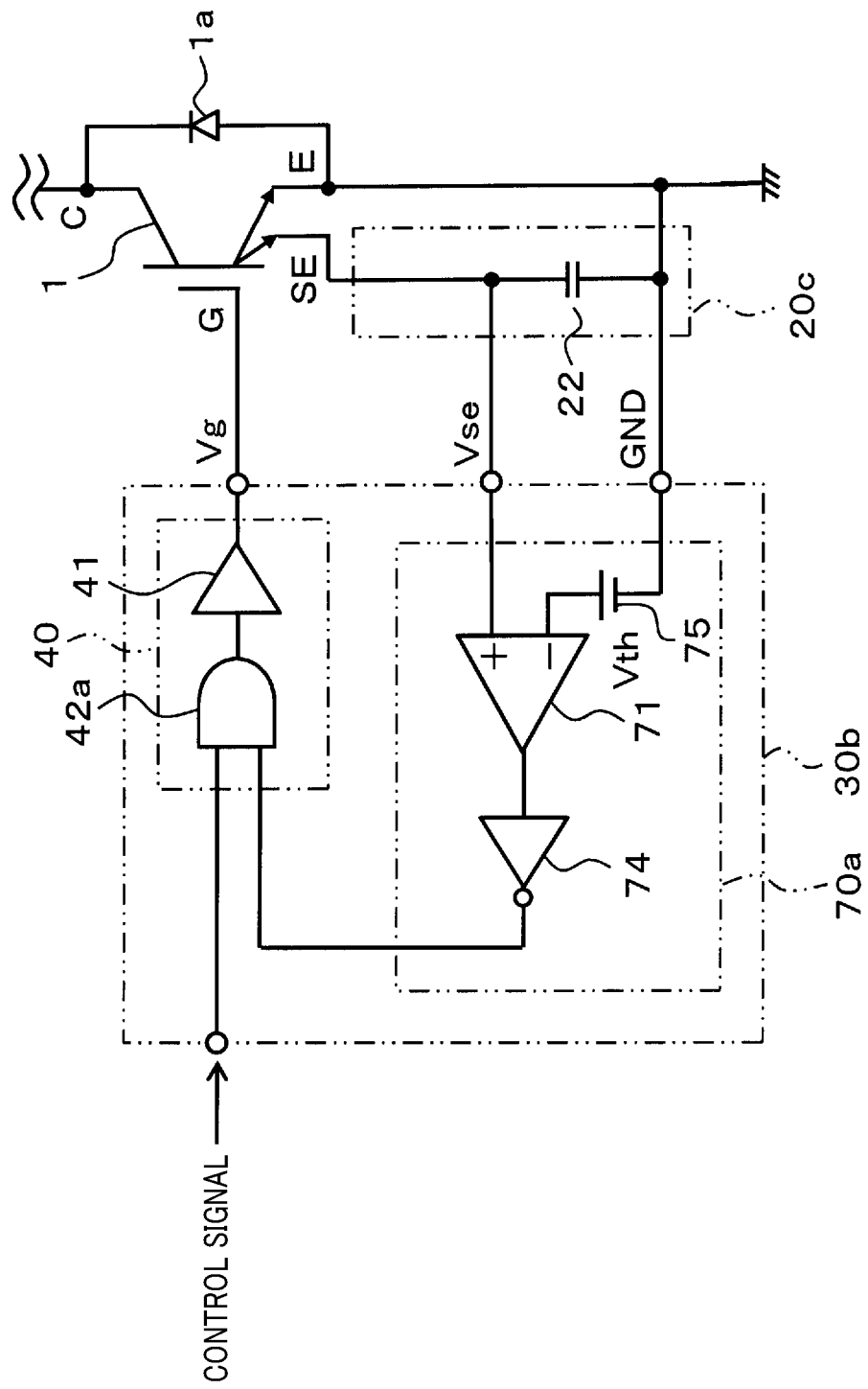
FIG. 16 is a specific electrical configuration diagram showing a seventh embodiment.
Figure 17:
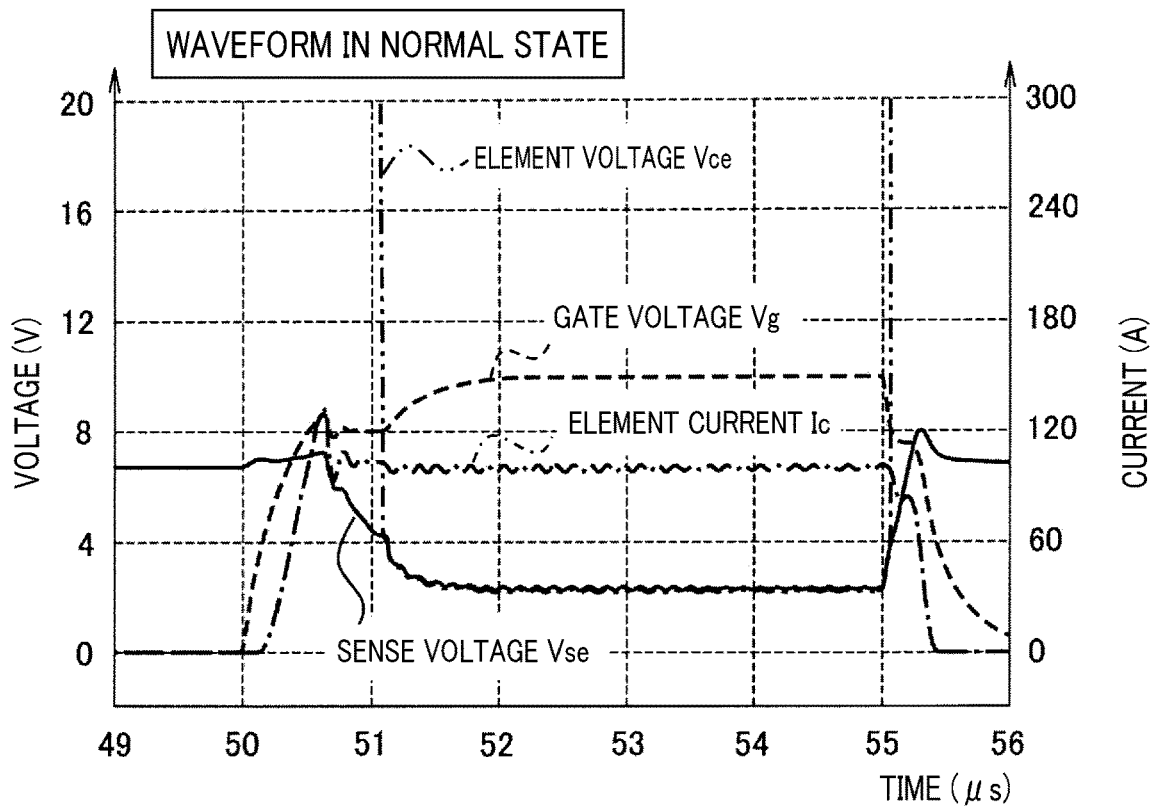
FIG. 17 is a time chart of signals of respective parts in a normal state.
Figure 18:
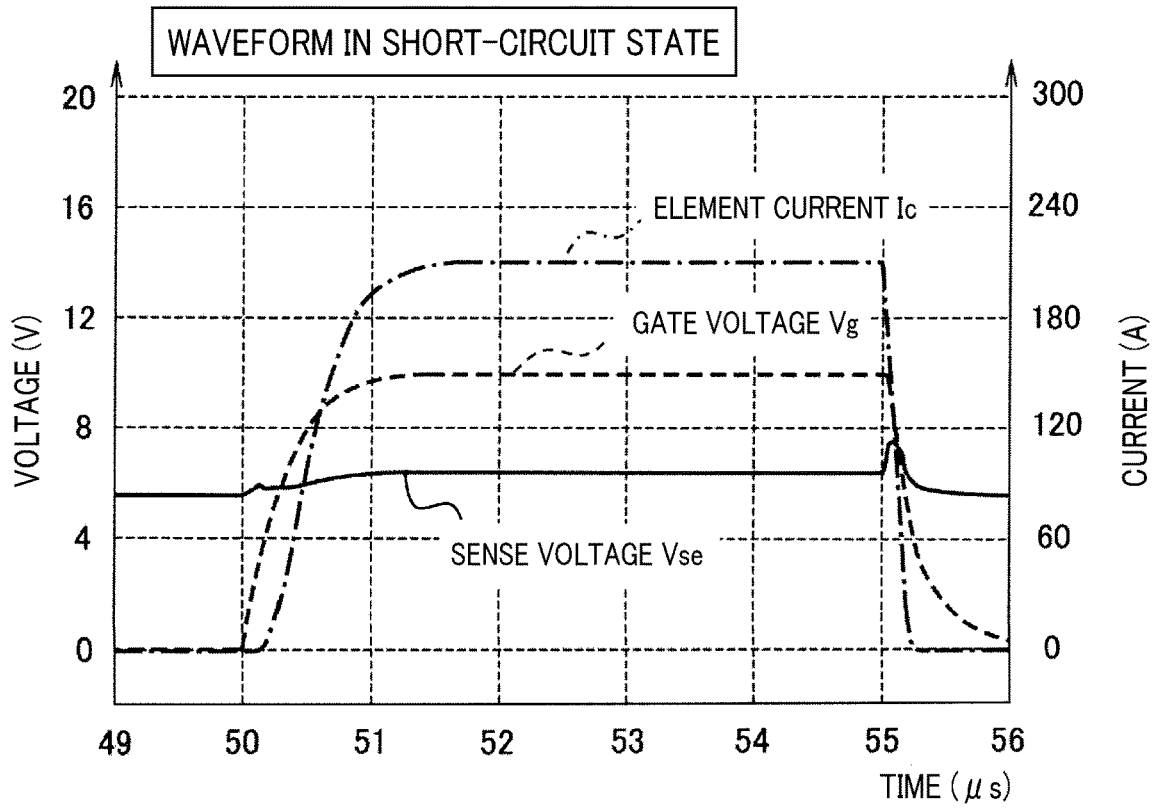
FIG. 18 is a time chart of signals of respective parts in a short-circuit state.

FIG. 16 to FIG. 18 show the seventh embodiment, and parts different from the fifth embodiment will be described below. This embodiment is adapted to a specific configuration of the fourth system with the basic configuration shown in FIG. 10. As shown in FIG. 16, in the configuration of the fifth embodiment, in an impedance circuit 20*c*, the capacitor 22 is provided independently and the current detection circuit 21 is not provided.

In the present embodiment, since the impedance circuit 20*c* has a configuration in which the capacitor 22 is connected to the sense terminal SE, the sense voltage Vse is configured to detect not a sense current of the sense element but a terminal voltage of the capacitor 22.

With such a configuration, since the sense voltage Vse appears as a voltage responding to a sense current, that is, a collector current of the IGBT 1, namely an on-voltage, the current level can be detected from the magnitude of the sense voltage Vse. Since an on-voltage Von is a value determined by the product of an on-resistance Ron and a current Ic, the level corresponding to the current Ic can be detected by preliminary measurement of the on-resistance Ron.

Therefore, as shown in FIG. 17, the IGBT 1 can be determined to be in a state of normal operation if from the time point when the control signal is provided and the gate voltage Vg is applied to the gate G of the IGBT 1 by the drive circuit 40, the sense voltage Vse changes to a value corresponding to the current level in the normal state.

In addition, as shown in FIG. 18, in a case where the sense voltage Vse exceeds the threshold Vth with which the current level in the normal state is determined, the state is in an overcurrent or a short-circuit state, and thus it can be determined that excessive current is flowing. The comparator 71, when having detected that excessive current is flowing from the level of the sense voltage Vse, outputs a high-level detection signal. Thereby, the AND circuit 42*a* of the drive circuit 40 receives a low-level signal via a NOT circuit 74, and thus stops application of the gate voltage Vg to the IGBT 1 to turn off the IGBT 1 and can perform the protection operation.

With the seventh embodiment described above, during the on-operation of the IGBT 1, even in a case where the mirror period during which the gate voltage Vg remains at the fixed level exists, it is possible to rapidly detect that the abnormal state of overcurrent or short-circuit has been generated by checking the level of the sense voltage Vse corresponding to the on-voltage Von, which enables the protection operation of stopping the drive circuit 40 to be performed.

Note that, in this embodiment, based on the above principle of determining the current level, when the IGBT 1 is in a normal state, the current Ic of the IGBT 1 can be also detected from the sense voltage Vse during the on-period.

Eighth Embodiment

FIG. 19 to FIG. 22 show the eighth embodiment and this embodiment is a circuit configuration for improving the accuracy of the current detection function in the sixth embodiment or the seventh embodiment. Since detection of current Ic of the IGBT 1 also enables detection of a current in the normal state in addition to the detection operation of overcurrent or short-circuit, the circuit configuration enables the detection to be performed accurately.

Figure 19:
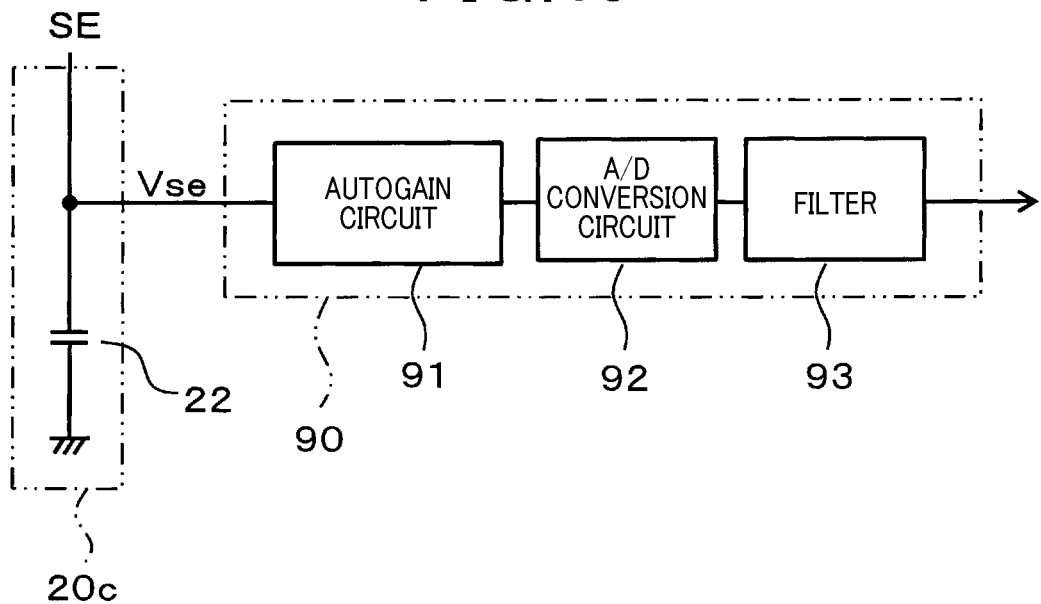
FIG. 19 is a block configuration diagram of a current detection circuit showing an eighth embodiment.

In FIG. 19, the control circuit 30b is provided with a current detection circuit 90. The current detection circuit 90 is provided so as to receive the sense voltage Vse. The current detection circuit 90 includes an autogain circuit 91, an A/D conversion circuit 92, and a filter 93. The autogain circuit 91 automatically adjusts a gain according to the level of the sense voltage Vse to enhance the resolution if a large current range is switched to a small current range in a wide detection range.

Figure 20:
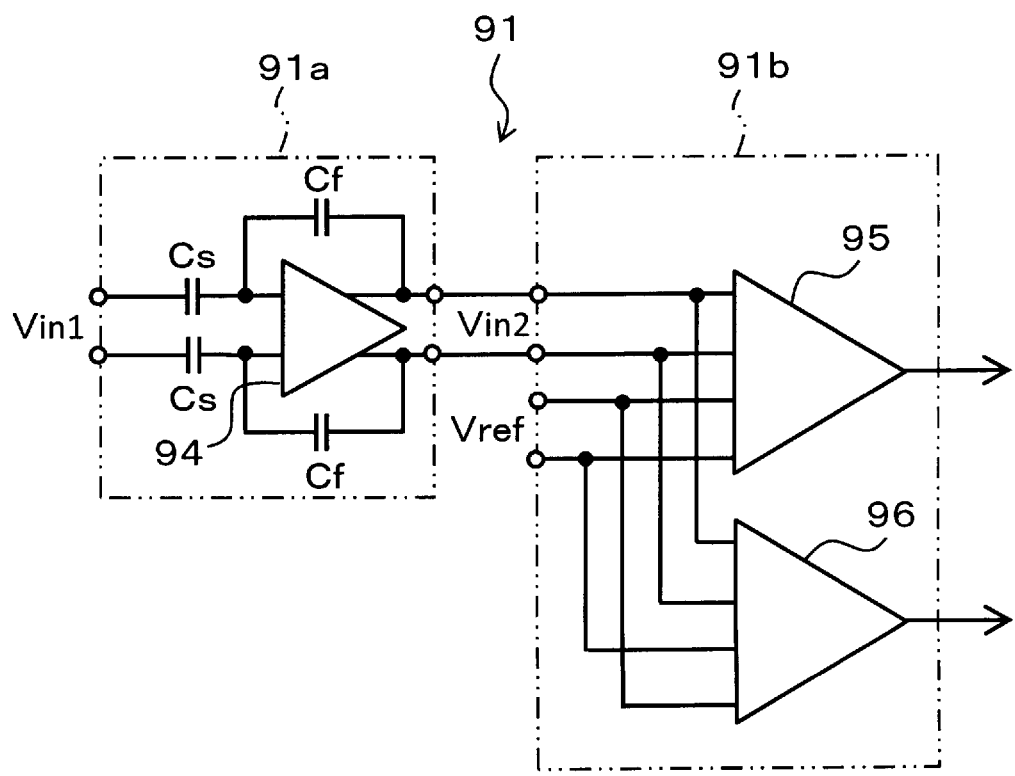
FIG. 20 is an electrical configuration diagram of an autogain circuit.

FIG. 20 is an example of a specific circuit configuration of the autogain circuit 91. It includes a gain amplifier 91a and a determination amplifier 91b. The gain amplifier 91a is composed of a switched capacitor circuit, and, in a case where the amplification result of two times an input voltage Vin1 by an amplifier 94 is within a range of −Vref to +Vref, performs an amplification operation again. This amplifies the input voltage Vin so that its amplitude is within an appropriate range in the A/D conversion.

The determination amplifier 91b includes a positive-side determination amplifier 95 and a negative-side determination amplifier 96. The positive-side determination amplifier 95 and the negative-side determination amplifier 96 each calculate and output a difference between an input voltage Vin2 and a reference voltage Vref. A signal converted into a digital signal via the A/D conversion circuit 92 is output via the filter 93. Thereby, digitized sensor data corresponding to the current value can be obtained.

Figure 21:
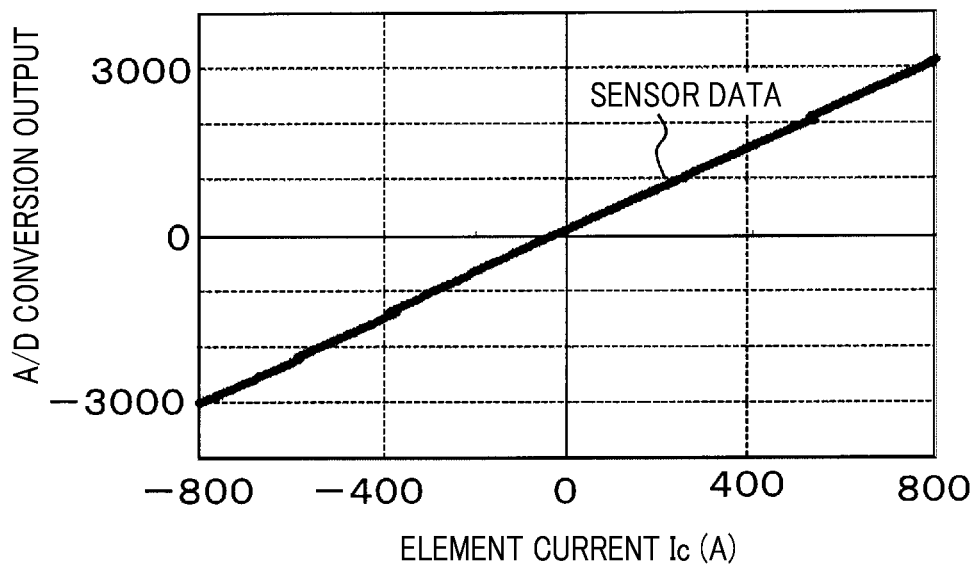
FIG. 21 is an explanatory diagram (part 1) of operation by the autogain circuit.
Figure 22:
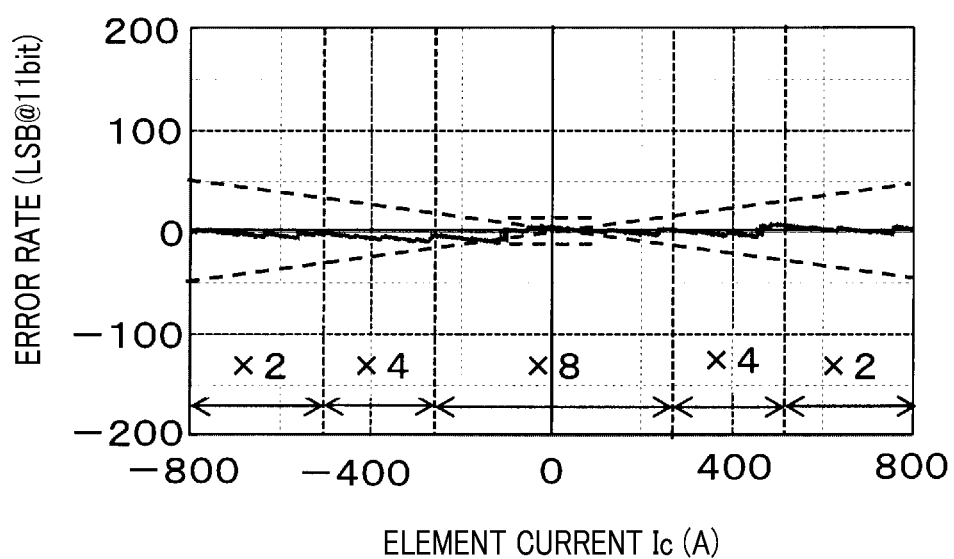
FIG. 22 is an explanatory diagram (part 2) of operation by the autogain circuit.

The digital data thus obtained, as shown in FIG. 21, can be obtained as linear sensor data in each of the positive and negative sides with respect to the value of the element current Ic. Note that, FIG. 22 shows an error rate that is generated as digital data when the signal is amplified by the autogain circuit 91. The error rates are obtained in a case where the signal is amplified eightfold in a region where the element current Ic is small, in a case of fourfold in an intermediate region, and in a case of twofold in a large region. The characteristics in which the error rates are flattened over a wide range can be obtained.

This makes it possible to take in the element current Ic as the digital data in a wide current range.

Note that this configuration of the embodiment can be additionally provided in the configurations of the first to fifth embodiments and also of the tenth and eleventh embodiments described below, and if it is provided in the control circuit 3, 30, 30a, 30b, 30c, 30d, 30e, or the like, for example, it can detect the current of the IGBT 1 in an on-state and it can be applied also to load control of a motor or the like.

Ninth Embodiment

Figure 23:
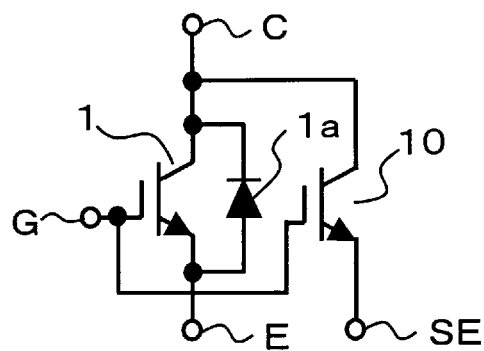
FIG. 23 is a configuration diagram (part 1) of a switching element showing a ninth embodiment.
Figure 24:
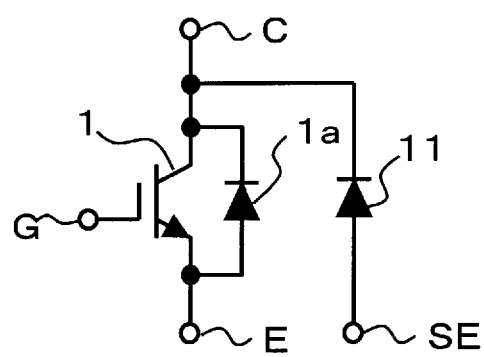
FIG. 24 is a configuration diagram (part 2) of the switching element.
Figure 25:
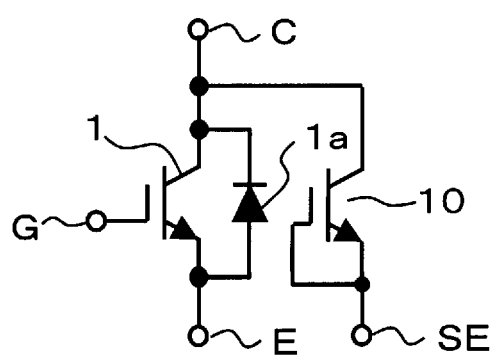
FIG. 25 is a configuration diagram (part 3) of the switching element.
Figure 26:
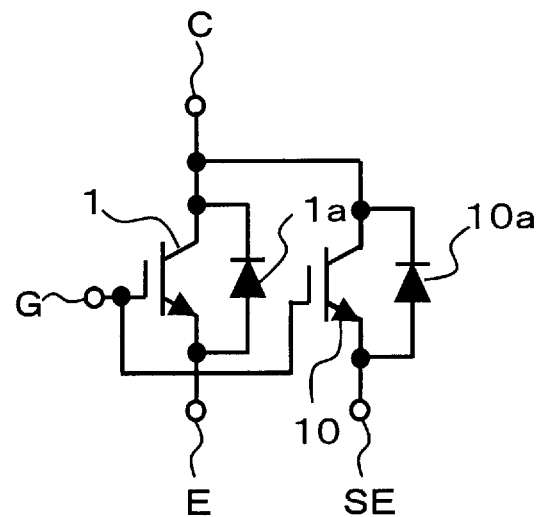
FIG. 26 is a configuration diagram (part 4) of the switching element.

FIG. 23 to FIG. 27 show the ninth embodiment and show an application example of the IGBT 1 applied as a switching element. In the above-described first to sixth embodiments, the IGBT 1 as a switching element is indicated by a symbol in which the sense emitter SE is branched as a sensor element accompanying a main element. This IGBT 1 can be indicated as shown in FIG. 23 or FIG. 26, for example.

For example, in a configuration shown in FIG. 23, a diode 1a is connected to a main element 1 and no diode is connected to a sense element 10. In addition, in a configuration shown in FIG. 26, the diode 1a is connected to the main element 1 and a diode 10a is also connected to the sense element 10.

In the configurations shown in FIG. 23 and FIG. 26, in the main element 1 and the sense element 10, the collectors C and the gates G are connected in common, and for the emitter E of the main element 1, the emitter of the sense element 10 is set as the sense emitter SE.

In contrast, in the configuration shown in the seventh embodiment is, as shown in FIG. 16, the sense current is not checked but the on-voltage Von of the sense element is detected, and thus a configuration of flowing a current as the sense element 10 is not needed. Therefore, a configuration in which a capacitance element utilizing a reverse characteristic of a PN junction, such as a diode, is provided at a portion of the sense element 10 may be adopted.

For example, for the configuration shown in FIG. 23 in which no diode is connected to the sense element 10, the configuration in which, as shown in FIG. 24, a diode 11 is provided in place of the sense element 10 is adopted. This can be implemented, for example, by adding a pattern that short-circuits the gate with the emitter or the collector inside the sense element 10 or by changing the sense element 10 to a diode structure.

In addition, for the configuration shown in FIG. 23 in which no diode is connected to the sense element 10, the similar configuration can be obtained by adopting a configuration in which, as shown in FIG. 25, the gate G of the sense element 10 is short-circuited with the emitter E. In this case, for the configuration shown in FIG. 23 in which no diode is connected to the sense element 10, the similar effect can be obtained also by adopting a configuration in which the gate G is short-circuited with the collector C.

Figure 27:
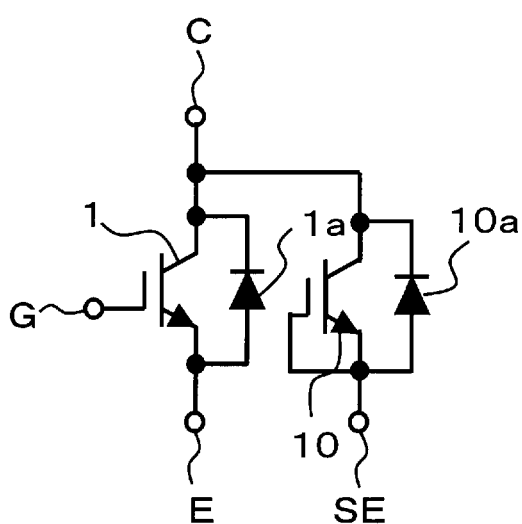
FIG. 27 is a configuration diagram (part 5) of the switching element.

Next, for the configuration shown in FIG. 26 in which the diode 10a is connected to the sense element 10, as shown in FIG. 27, the configuration of making both the sense element 10 and the diode 10a function as diodes can be obtained by performing wiring for short-circuiting between the gate G and sense emitter SE of the sense element 10. In this case, for the configuration shown in FIG. 26 in which the diode is connected to the sense element 10, the similar effect can be obtained by adopting a configuration in which the gate is short-circuited with the collector.

Therefore, as the IGBT 1 of the configuration shown in FIG. 16, those shown in FIG. 24, FIG. 25, and FIG. 27 can be used. Since the sense element 10 is thus provided as the diode, the voltage corresponding to the on-voltage can be detected by detecting the sense voltage Vse in a state in which the IGBT 1 is turned on. In addition, this enables to detect the element current Ic.

Tenth Embodiment

Figure 28:
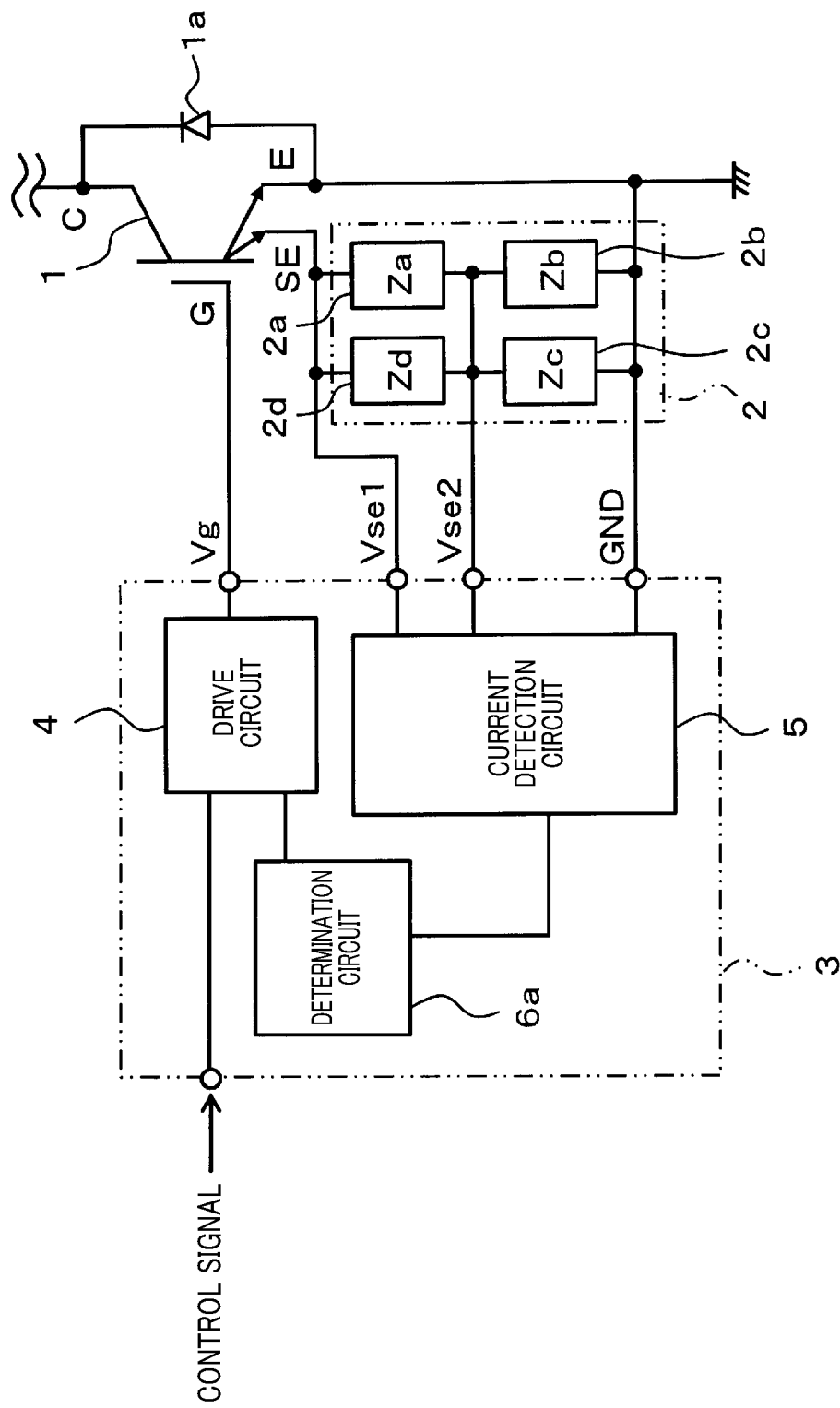
FIG. 28 is an electrical configuration diagram of a basic configuration showing a tenth embodiment.

FIG. 28 to FIG. 31 show the tenth embodiment, and parts different from the sixth embodiment will be described below. This embodiment, as shown in FIG. 28, is a configuration that performs the detection with the sense voltage Vse as a sense voltage Vse2 and the voltage of the sense emitter SE of the IGBT 1 as a sense voltage Vse1 for the third system by the basic configuration shown in FIG. 10. That is, the terminal voltage of the resistor 23 is set to the sense voltage Vse1 and the terminal voltage of the capacitor 22 is set to the sense voltage Vse2.

Figure 29:
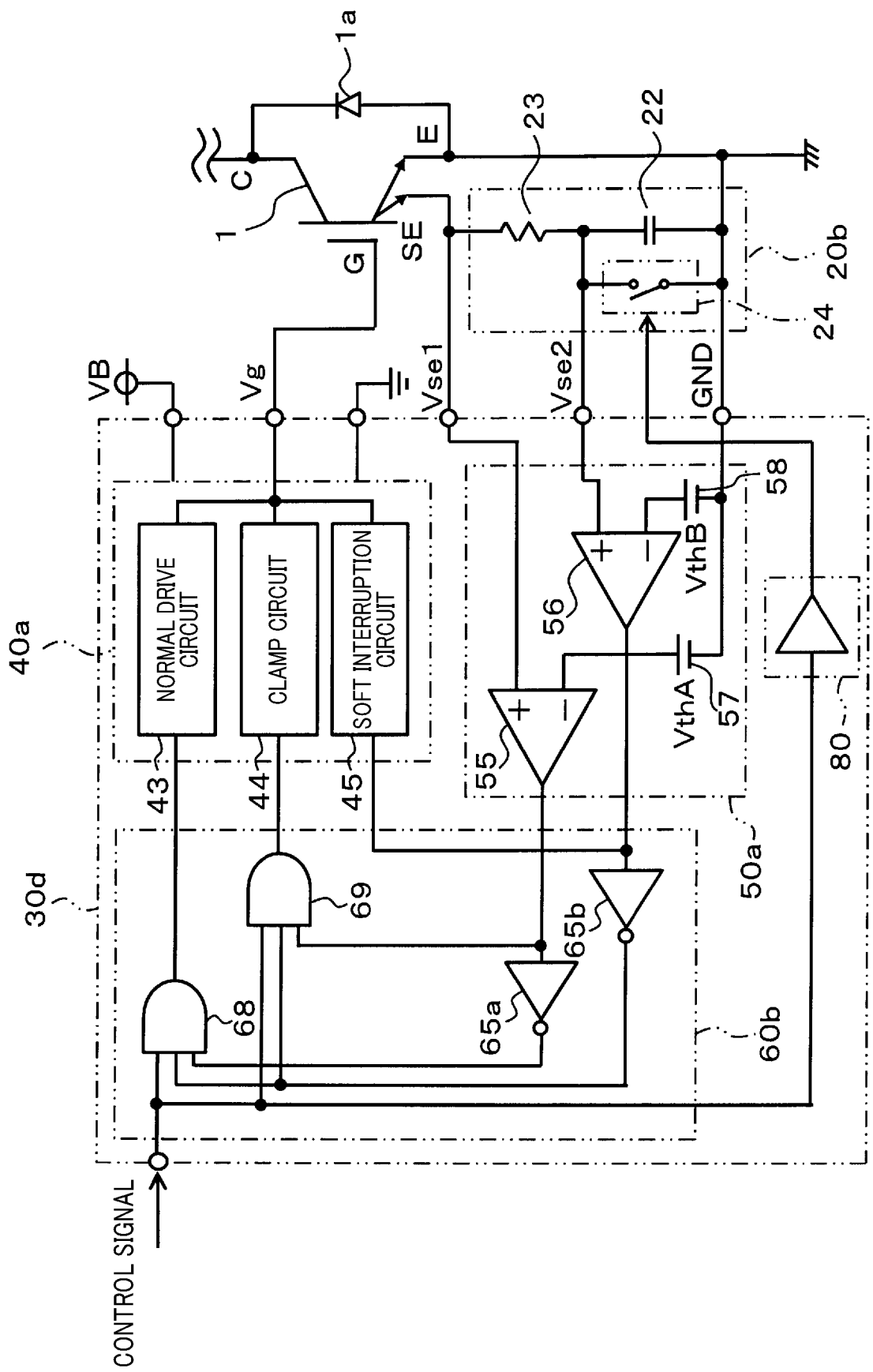
FIG. 29 is a specific electrical configuration diagram.

Specifically, as shown in FIG. 29, the control circuit 30d includes a drive circuit 40a, a current detection circuit 50a, a determination circuit 60b, and the switch control circuit 80. The drive circuit 40a has a normal drive circuit 43, a clamp circuit 44, and a soft interruption circuit 45 provided in parallel and is configured to supply or interrupt the gate voltage Vg to the gate G of the IGBT 1. The drive circuit 40a is connected between a power source VB for voltage application and the IC ground.

The normal drive circuit 43 is similar to the drive circuit 41 in the sixth embodiment and applies the gate voltage Vg to the gate of the IGBT 1 upon receiving a control signal from the outside. The clamp circuit 44 is a circuit that clamps the gate voltage Vg to a predetermined voltage when a clamp signal is supplied. In addition, the soft interruption circuit 45, when a soft interruption signal is supplied, soft-interrupts the collector current Ic while suppressing generation of a surge voltage between the collector and emitter of the IGBT 1 by reducing the gate voltage Vg of the IGBT 1 at a speed slower than that of the normal drive circuit 43.

The drive circuit 40a, as described below, is configured so that the normal drive circuit 43 is driven in a normal state, and when an overcurrent flows in the IGBT 1 and a clamp signal is provided, the normal drive circuit 43 is turned off and the clamp circuit 44 is operated instead. When a soft interruption signal is input in a state in which the overcurrent continues to flow and the clamp signal is not released, the clamp circuit 44 is turned off and the soft interruption circuit 45 is operated instead. Note that, if the clamp signal is released before the soft interruption signal is input in a state in which the clamp circuit 44 is being operated, the operation of the clamp circuit 44 is stopped and the state in which the normal drive circuit 43 is operated again can be resumed.

The current detection circuit 50a includes a fifth comparator 55 and a sixth comparator 56 and also includes reference power supplies 57 and 58. In the current detection circuit 50a, the fifth comparator 55 receives the sense voltage Vse1 at the non-inverting input terminal and receives the threshold voltage VthA at the inverting input terminal from the reference power supply 57. The fifth comparator 55 outputs a clamp signal when the sense voltage Vse1 exceeds the threshold voltage VthA.

The sixth comparator 56 receives the sense voltage Vse2 at the non-inverting input terminal and receives the threshold voltage VthB at the inverting input terminal from the reference power supply 58. The sixth comparator 56, when the sense voltage Vse2 exceeds the threshold voltage VthB, determines that the overcurrent is detected and provides the soft interruption signal to the input terminal of the soft interruption circuit 45.

The determination circuit 60b includes AND circuits 68, 69 and inverter circuits 65a, 65b. The AND circuit 68 includes three input terminals and receives a control signal at one of them from the outside. The other input terminals of the AND circuit 68 receive a clamp signal from the fifth comparator 55 via the inverter circuit 65a and receive a soft interruption signal from the sixth comparator 56 via the inverter circuit 65b. The output terminal of the AND circuit 68 is connected to the input terminal of the normal drive circuit 43 of the drive circuit 40a.

The AND circuit 69 includes three input terminals and receives a control signal at one of them from the outside. The other input terminals of the AND circuit 69 receive a clamp signal from the fifth comparator 55 and receive a signal inverted to a low level from the sixth comparator 56 via the inverter circuit 65b. The output terminal of the AND circuit 69 is connected to the input terminal of the clamp circuit 44.

In the above configuration, the threshold voltage VthA of the reference power supply 57, which the sense voltage Vse1 does not reach when the collector current Ic of the IGBT 1 is normal, is a level set to exceed the sense voltage Vse1 when the collector current Ic becomes an overcurrent. In addition, the threshold voltage VthB of the reference power supply 58, which the sense voltage Vse2 does not reach when the collector current Ic of the IGBT 1 is normal, is a level set to exceed the sense voltage Vse2 when the collector current Ic becomes an overcurrent.

Figure 30:
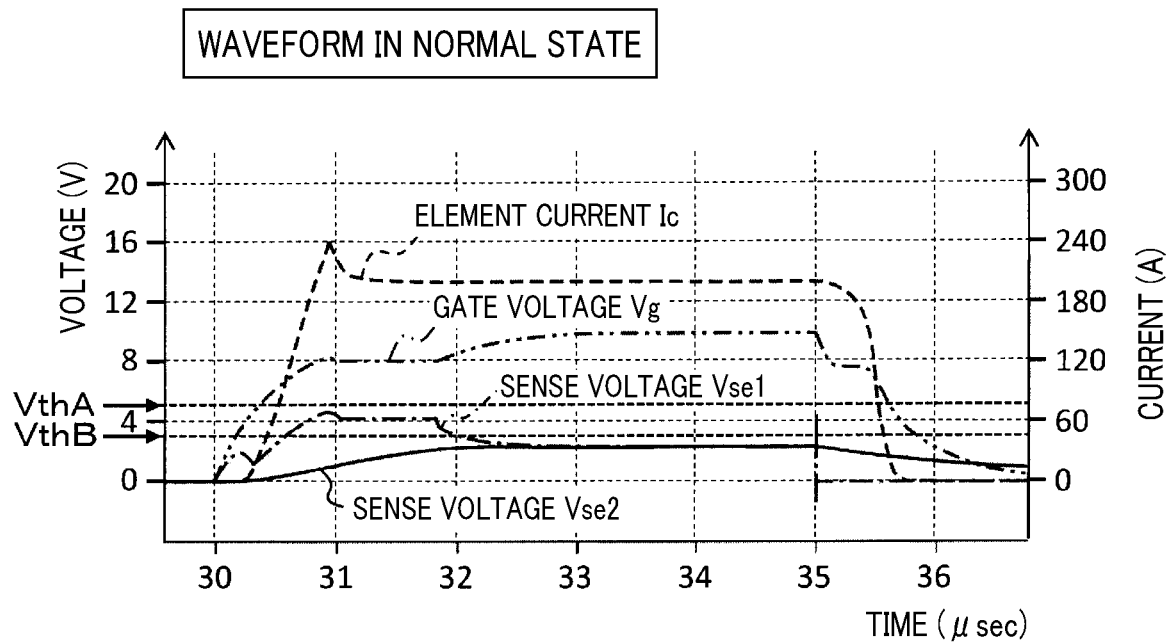
FIG. 30 is a time chart of signals of respective parts in a normal state.
Figure 31:
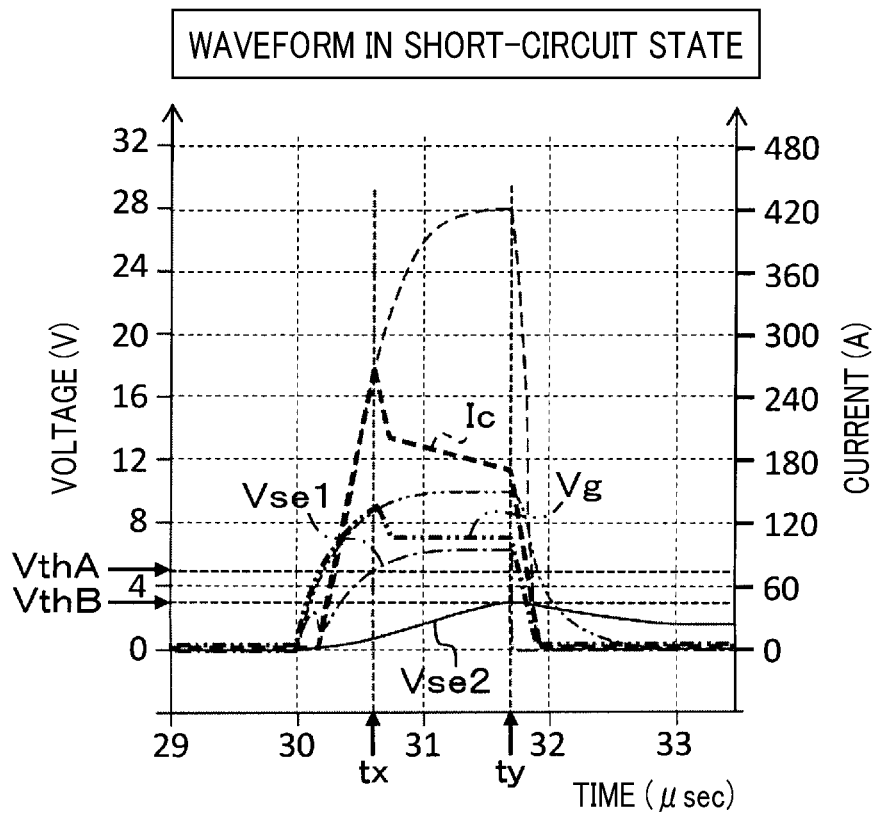
FIG. 31 is a time chart of signals of respective parts in a short-circuit state.

Next, operation of the above configuration will be described also with reference to FIG. 30 and FIG. 31. FIG. 30 and FIG. 31 show simulation results of time change of the element current Ic and the sense voltages Vse1 and Vse2 after application of the gate voltage Vg to the IGBT 1 in a normal state, that is, an ordinary state and in a short-circuit state, respectively.

In the above configuration, when a control signal is supplied from the outside and a high-level drive signal is provided from the AND circuit 68 of the determination circuit 60b to the normal drive circuit 43 of the drive circuit 40a, the gate voltage Vg is applied from the normal drive circuit 43 to the gate G of the IGBT 1. Thereby, the IGBT 1 is turned on. Note that, before the current rises after the start of the on-operation of the IGBT 1, the switch 24 is controlled into an off-state. Note that, before the switch 24 is controlled into the off-state, the switch 24 is set to an on-state by the switch control circuit 80 and the electric charge of the capacitor 22 is discharged.

With this, in the IGBT 1, as shown in FIG. 30, the gate voltage Vg increases, and is kept in a voltage lower than a predetermined level during the mirror period. After the mirror period has elapsed, the gate voltage Vg increases to the predetermined level. In addition, the element current Ic transiently generates a recovery current at the rise of the gate voltage Vg and then settles to a fixed level.

The sense voltage Vse1 has a small peak at the rise of the gate voltage Vg, then becomes a high voltage during the mirror period, and decreases somewhat to become a fixed level lower than the threshold voltage VthA after the mirror period has elapsed. The sense voltage Vse2 gradually increases in a state in which the transient variation is absorbed. This is because the transient variation amount is absorbed by the capacitor 22 of the impedance circuit 20b, and the sense voltage Vse2 is obtained as a terminal voltage along with charging of the capacitor 22. At this time, the sense voltage Vse2 is also a voltage lower than the threshold voltage VthB.

In contrast, in a state in which the IGBT 1 is short-circuited, as shown in FIG. 31, the element current IC significantly increases beyond a predetermined level. In addition, the gate voltage Vg also increases without going through the mirror period. In this case, the sense voltage Vse1, which is a sense emitter voltage, increases without going through the mirror period. In addition, the sense voltage Vse2 gradually increases along with charging of the capacitor 22.

As indicated with a thin dashed-dotted line in FIG. 31, the sense voltage Vse1 first reaches the threshold voltage VthA at time tx. With this, in the current detection circuit 50a, the output of the fifth comparator 55 becomes a high level and the clamp signal is output to the clamp circuit 44 via the AND circuit 69. In addition, a signal inverted to a low level via the inverter circuit 65b is output to the normal drive circuit 43 via the AND circuit 68. Thereby, the normal drive circuit 43 stops the gate voltage Vg to the IGBT 1, and the clamp circuit 44 sets a clamp state so that the gate voltage Vg of the IGBT 1 becomes a predetermined voltage.

As indicated with a thick dashed-two dotted line in FIG. 31, a flat state of the gate voltage Vg is maintained after the time tx. In a case of not being clamped, the gate voltage Vg further increases also after the time tx, as indicated with a thin dashed-two dotted line in FIG. 31. Then, when the gate voltage Vg is clamped, as indicated with a thick broken line in FIG. 31, the collector current Ic of the IGBT 1 also becomes a clamped state following the gate voltage Vg. Note that, in a case where the gate voltage Vg is not clamped, the collector current Ic of the IGBT 1 further increases as indicated with a thin broken line in FIG. 31, and thus the gate voltage Vg can be maintained in a state in which this current increased amount is prevented from flowing.

After that, if the overcurrent of the IGBT 1 continues, as indicated with a solid line in FIG. 31, the sense voltage Vse2 reaches the threshold voltage VthB at time ty. With this, in the current detection circuit 50a, the sixth comparator 56 outputs a high level indicating the overcurrent detection and inputs a high-level soft interruption signal to the soft interruption circuit 45. In addition, the sixth comparator 56 inputs a signal inverted to the low level to the AND circuits 68 and 69 via the inverter circuit 65b.

With this, the normal drive circuit 43 maintains the state in which the gate voltage Vg to the IGBT 1 is stopped, and the clamp circuit 44 stops application of the clamped gate voltage Vg to the IGBT 1. Then, the soft interruption circuit 45 gradually reduces the gate voltage Vg of the IGBT 1 in accordance with a soft drive signal to shift the IGBT 1 to an off-state. Thereby, the IGBT 1 is turned off and the state in which the overcurrent flows is released.

Note that, in the above case, the sense voltage Vse1 is once determined based on the threshold voltage VthA and the gate voltage Vg is clamped because the case where the collector current Ic flowing in the IGBT 1 temporarily becomes an overcurrent state is assumed. That is, in a case where the overcurrent of the IGBT1 is temporary and returns to the normal state before the sense voltage Vse2 reaches the threshold voltage VthB, the overcurrent detection state by the fifth comparator 71a is released and the IGBT 1 can return to the drive control in the normal state.

According to the tenth embodiment described above, in a case where the overcurrent starts to flow in the IGBT 1 and the sense voltage Vse1 exceeds the threshold VthA, the gate voltage Vg of the IGBT 1 is clamped to suppress increase of the overcurrent. This can suppress the overcurrent from continuing to flow in the IGBT 1.

Then, in a case where the overcurrent continues to flow in the IGBT 1, since the soft interruption circuit 45 gradually reduces the gate voltage Vg, the IGBT 1 can be shifted to the off-state in a state in which generation of a surge voltage is suppressed when the IGBT 1 is turned off.

In addition, in a case where the overcurrent continues to flow in the IGBT 1 and the sense voltage Vse2 exceeds the threshold VthB, the IGBT 1 is turned off. This can suppress the overcurrent from continuing to flow in the IGBT 1 to break down the IGBT 1. Further, in a case where the overcurrent of the IGBT 1 is temporary, it is possible to continue an energized state without turning off the IGBT 1.

Note that, the above embodiment shows a case of the configuration in which the soft interruption circuit 45 is provided in the drive circuit 40a, but a configuration without the soft interruption circuit may be also adopted.

Eleventh Embodiment

Figure 32:
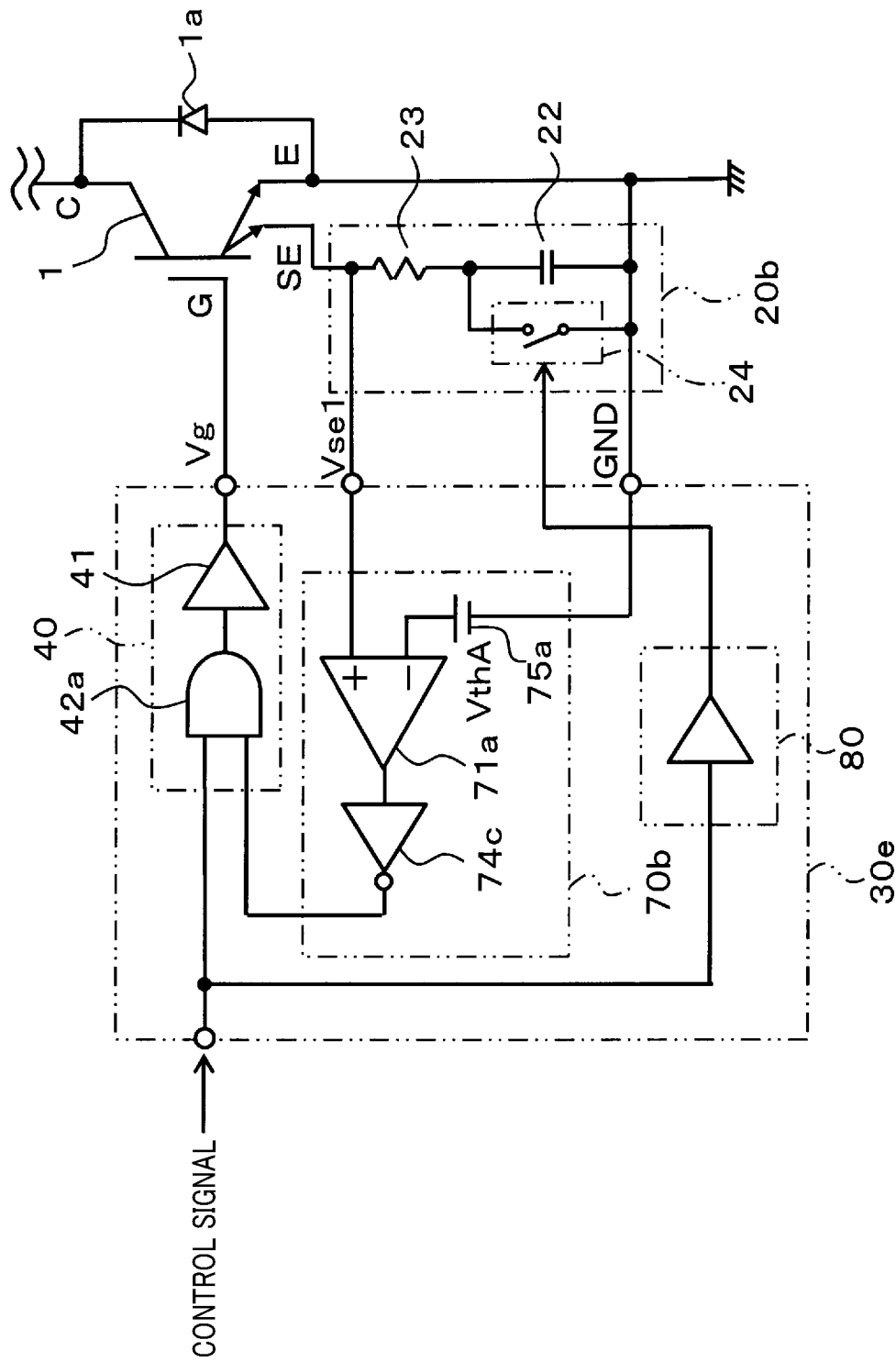
FIG. 32 is a specific electrical configuration diagram showing an eleventh embodiment.
Figure 33:
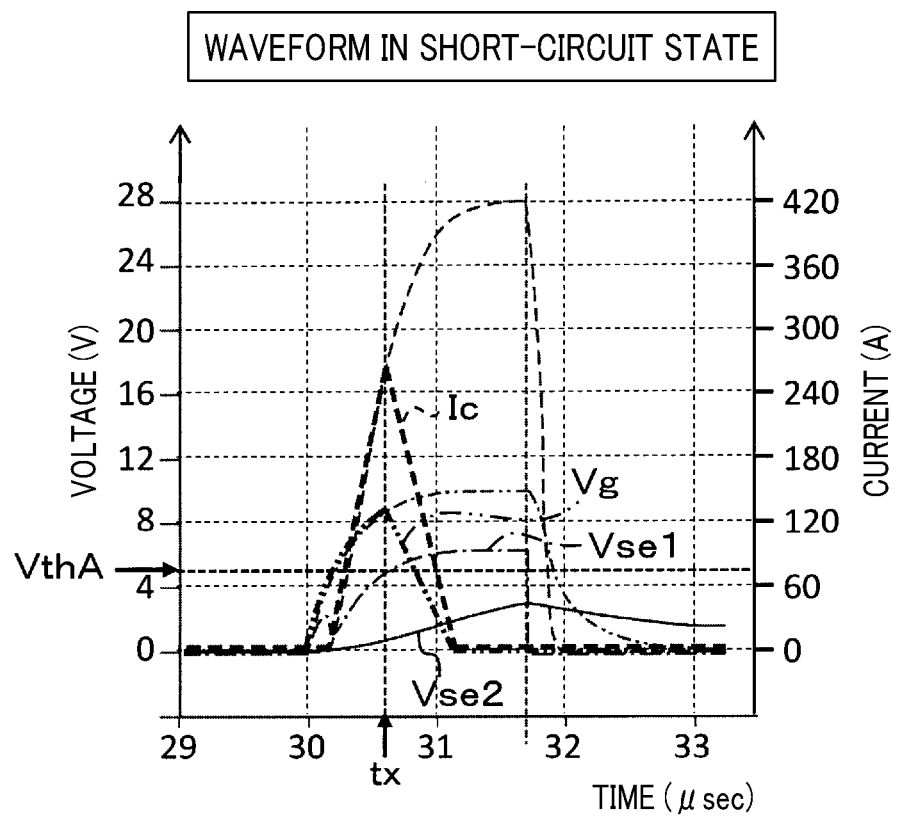
FIG. 33 is a time chart of signals of respective parts in a short-circuit state.

FIG. 32 and FIG. 33 show the eleventh embodiment, and parts different from the tenth embodiment will be described below. In the tenth embodiment, the gate drive of the IGBT 1 is controlled by detection of the sense voltages Vse1 and Vse2, while in the present embodiment, the gate drive of the IGBT 1 is controlled only by the sense voltage Vse1.

In FIG. 32, a control circuit 30e includes the drive circuit 40, an overcurrent detection circuit 70b, and the switch control circuit 80. The overcurrent detection circuit 70b functions as both the current detection circuit 5 and the determination circuit 6a shown in FIG. 28. The drive circuit 40 includes the driver circuit 41 and the AND circuit 42a and includes no clamp circuit.

In the overcurrent detection circuit 70b, the fifth comparator 71a receives the sense voltage Vse1 at the non-inverting input terminal and receives the threshold voltage VthA at the inverting input terminal from a reference power supply 75a. The fifth comparator 71a, when the sense voltage Vse1 exceeds the threshold voltage VthA, outputs an overcurrent detection signal to the AND circuit 42a of the drive circuit 40 via an inverter circuit 74c.

Next, operation of the above configuration will be described also with reference to FIG. 33. FIG. 33 shows a simulation result of time change of the element current Ic and the sense voltages Vse1 and Vse2 after application of the gate voltage Vg to the IGBT 1 in a short-circuit state.

The IGBT 1 performs on-operation when a control signal is provided from the outside similarly to the above and the gate voltage Vg is applied from the drive circuit 40a to the gate G of the IGBT 1. In a normal state, the element current Ic, the gate voltage Vg, and the sense voltages Vse1, Vse2 change as shown in FIG. 30 illustrated in the tenth embodiment.

Then, in a state in which the IGBT 1 is short-circuited, as shown in FIG. 33, the element current Ic significantly increases beyond a predetermined level and the gate voltage Vg also increases without going through the mirror period. In addition, the sense voltage Vse1 increases without going through the mirror period and the sense voltage Vse2 gradually increases along with charging of the capacitor 22.

As indicated with a thin dashed-dotted line in FIG. 33, when the sense voltage Vse1 first reaches the threshold voltage VthA at time tx, in the overcurrent detection circuit 70b, the fifth comparator 71a outputs a high-level overcurrent detection signal. With this, the AND circuit 42a of the drive circuit 40 receives a low-level signal via the inverter circuit 74c and the drive circuit 40 turns off the IGBT 1. This puts the IGBT 1 in an off-state to release the state in which the overcurrent flows.

That is, while in the tenth embodiment, the gate voltage Vg is once clamped when the sense voltage Vse1 reaches the threshold voltage VthA, the present embodiment performs control to turn off the IGBT 1 at this time point.

Therefore, according to the eleventh embodiment described above, the IGBT 1 is turned off in a case where the overcurrent starts to flow in the IGBT 1 and the sense voltage Vse1 exceeds the threshold voltage VthA. This can suppress the overcurrent from continuing to flow in the IGBT 1 to break down the IGBT 1.

Note that, useful one of the tenth and eleventh embodiments can be appropriately selected and used according to conditions, such as tolerance of the IGBT 1, detection accuracy of the control circuits 30d, 30e, or noise environment.

Twelfth Embodiment

Figure 34:
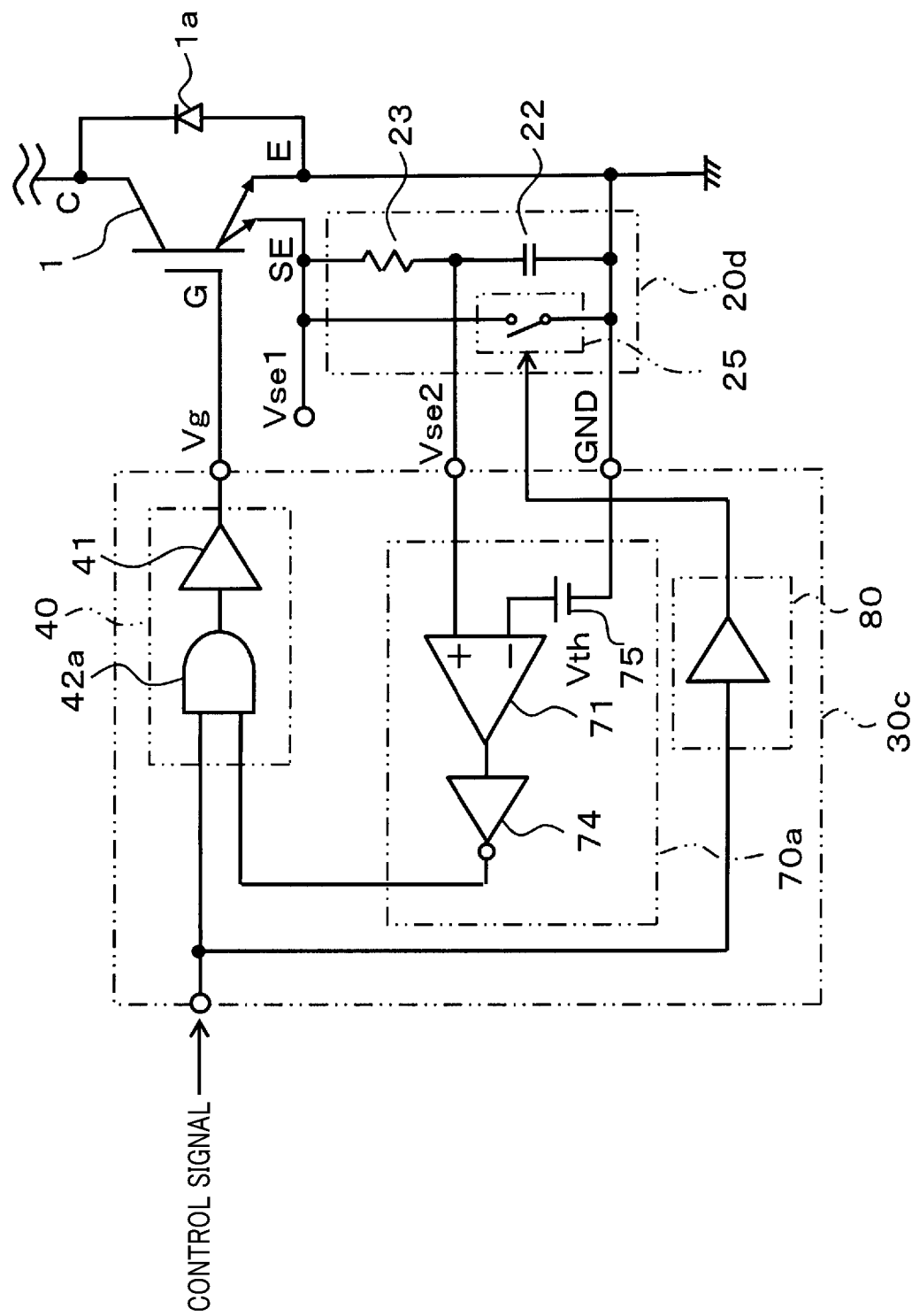
FIG. 34 is a specific electrical configuration diagram showing a twelfth embodiment.
Figure 35:
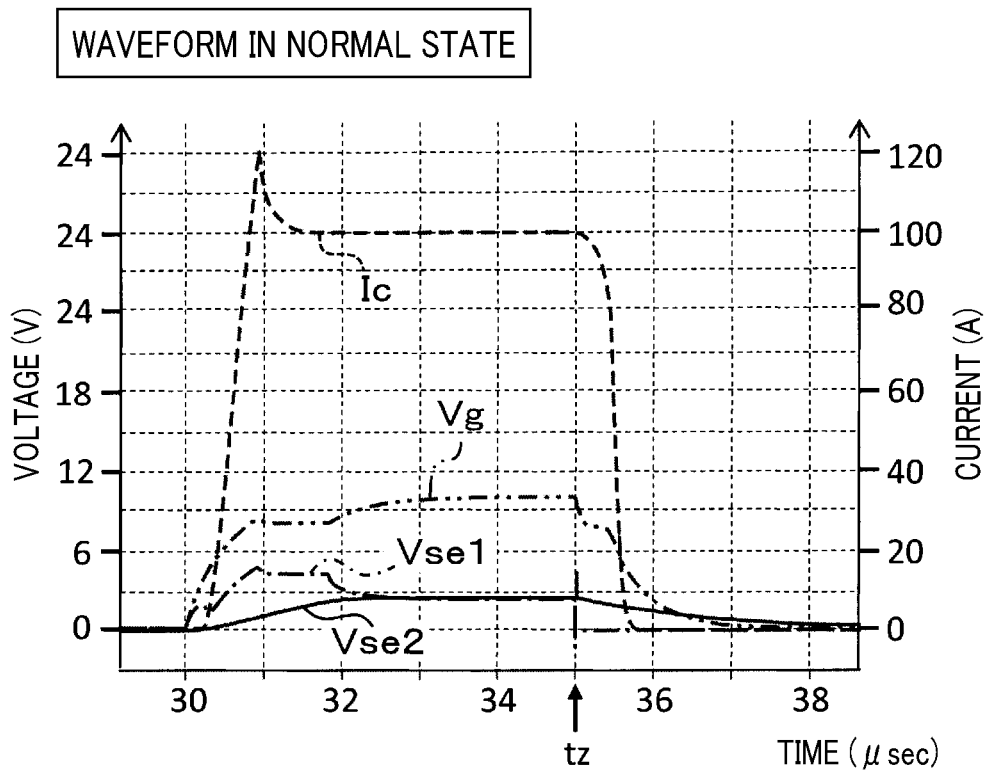
FIG. 35 is a time chart of signals of respective parts in a normal state.
Figure 36:
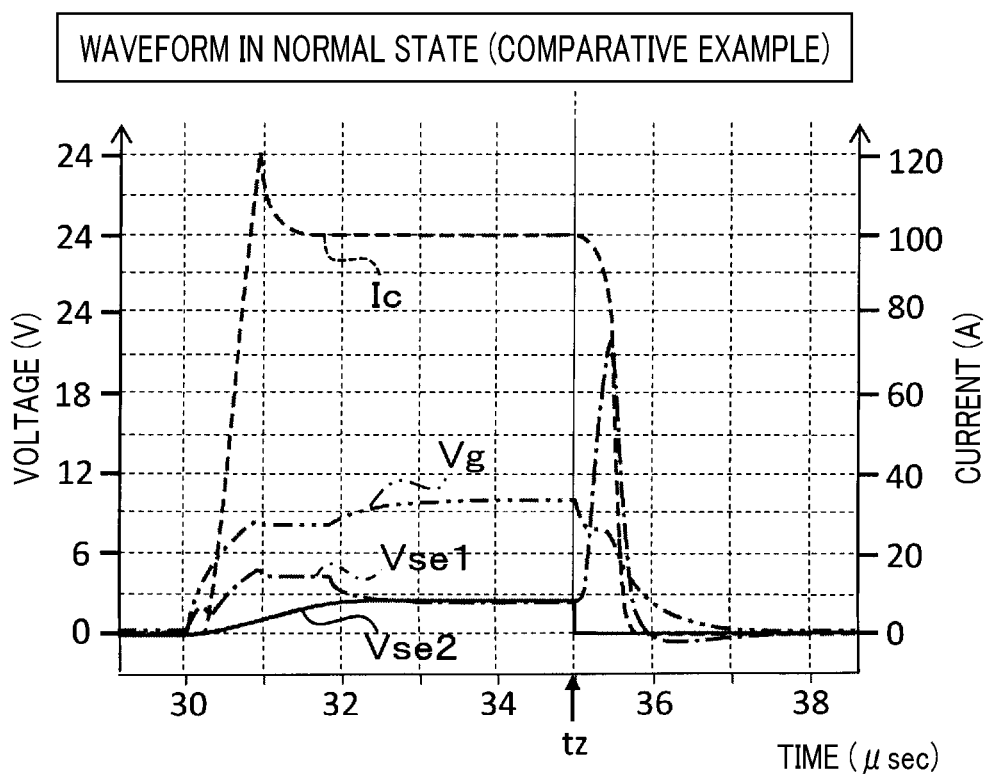
FIG. 36 is a time chart of signals of respective parts in a normal state (Comparative Example)

FIG. 34 to FIG. 36 show the twelfth embodiment, and parts different from the sixth embodiment will be described below. This embodiment effectively functions in a case where in the configuration of an impedance part 20d, a resistance value of the impedance Za of the resistor 23 as the sense resistor is set relatively large. The large resistance value of the resistor 23 allows an electrical potential of the sense emitter to easily fluctuate when the IGBT 1 is switched off.

That is, in FIG. 34, the impedance part 20d is provided with a switch 25 that is connected between both terminals of a series circuit of the resistor 23 and the capacitor 22, as a discharge switch, in place of the switch 24 that is connected between both terminals of the capacitor 22. The switch 25 forms a discharge path of the capacitor 22 with the resistor 23 interposed. In addition, the switch 25 also functions in the discharge of electric charge due to the capacitance component of the sense emitter. In a state in which no control signal is provided from the outside, the switch 25 is maintained in the on-state by the switch control circuit 80. With this, the capacitor 22 is in a state in which the electric charge is discharged through the resistor 23.

Here, the sense voltage Vse2 is, as the terminal voltage of the capacitor 22, input to the non-inverting input terminal of the comparator 71 of the overcurrent detection circuit 70a. In addition, the sense voltage Vse1 is the terminal voltage of the sense emitter SE and is not input to the control circuit 30c but used for comparison in the operation described below.

With the above configuration, when the control signal is provided from the outside, the drive circuit 40 applies the gate voltage Vg to the gate G of the IGBT 1 to turn on the IGBT 1. At this time, the switch 25 becomes an open state because a signal of off-operation is provided from the switch control circuit 80. In the IGBT 1, in a normal state, as shown in FIG. 35, the gate voltage Vg increases and then increases to a predetermined level after going through the mirror period.

The element current Ic of the IGBT 1 transiently overshoots at rise of the gate voltage Vg similarly to the above, and then settles to a fixed level. Here, at the sense terminal SE, the sense voltage Vse1 is maintained at a high voltage during the mirror period and then reduced to a predetermined level and settles. In addition, the sense voltage Vse2 does not become a high voltage during the mirror period and gradually increases in a state in which the transient variation is absorbed. This is because the transient variation amount is absorbed by the capacitor 22 of the impedance circuit 20d and the sense voltage Vse2 is obtained as the terminal voltage along with charging of the capacitor 22.

After that, as shown in FIG. 35, when the control signal from outside changes to a state corresponding to the off-operation at time tz, the drive circuit 40 sets the gate voltage Vg that is provided to the gate of the IGBT 1 to a low level. With this, the IGBT 1 is turned off and the element current Ic and the gate voltage Vg decrease. In addition, at the time tz, since the switch 25 is turned on by the switch control circuit 80, the series circuit of the capacitor 22 and the resistor 23 is short-circuited. When the switch 25 is turned on, the sense voltage Vse1 changes to the ground level. Further, the turn-on of the switch 25 gradually discharges the electric charge of the capacitor 22 through the resistor 23, and thus the sense voltage Vse2 gradually decreases.

FIG. 36 is shown for comparison with the present embodiment and shows waveforms in a case of a configuration in which the switch 24 is provided to cause a short-circuit between the both terminals of the capacitor 22, as in the configuration of the sixth embodiment. With this configuration, when the control signal from the outside changes to a state corresponding to the off-operation at the time tz, if the capacitor 22 is short-circuited by the switch 24, the sense voltage Vse1 of the sense emitter SE may rise suddenly as shown in the figure. This is because temporarily the sense voltage Vse1 rises suddenly by the discharge of the electric charge due to the capacitance component of the sense emitter through the resistor 23. Then, this tendency is noticeable if the resistance value of the resistor 23 is large, and with this, in a case where the rising voltage becomes high, the IGBT 1 may malfunction or lead to element break down or the like.

In this regard, in the present embodiment, since the electric charge of the capacitor 22 is discharged through the resistor 23, the malfunction or the element break down of the IGBT 1 can be avoided without sudden change of the sense voltage Vse1. Note that, meanwhile, the operation in the case where the IGBT 1 is short-circuited is the same as that of the sixth embodiment.

Therefore, according to the twelfth embodiment, effects similar to those of the sixth embodiment can be obtained. Further, according to the present embodiment, the following effects can be obtained. As in this embodiment, in a case where the capacitance of the capacitor 22 is set small in a state in which the level of a time constant obtained by the capacitor 22 and the resistor 23 is maintained, the resistance value of the resistor 23 is set large. Even in a case of such a configuration, it is possible to avoid the malfunction and the element break down of the IGBT 1 when it is turned off by adopting a configuration of discharging the electric charge of the capacitor 22 with the switch 25 through the resistor 23.

Note that, the configuration of the impedance part 20d used in the above configuration may be applied to the tenth embodiment or the eleventh embodiment so that the sense voltages Vse1, Vse2 are used.

Thirteenth Embodiment

Figure 37:
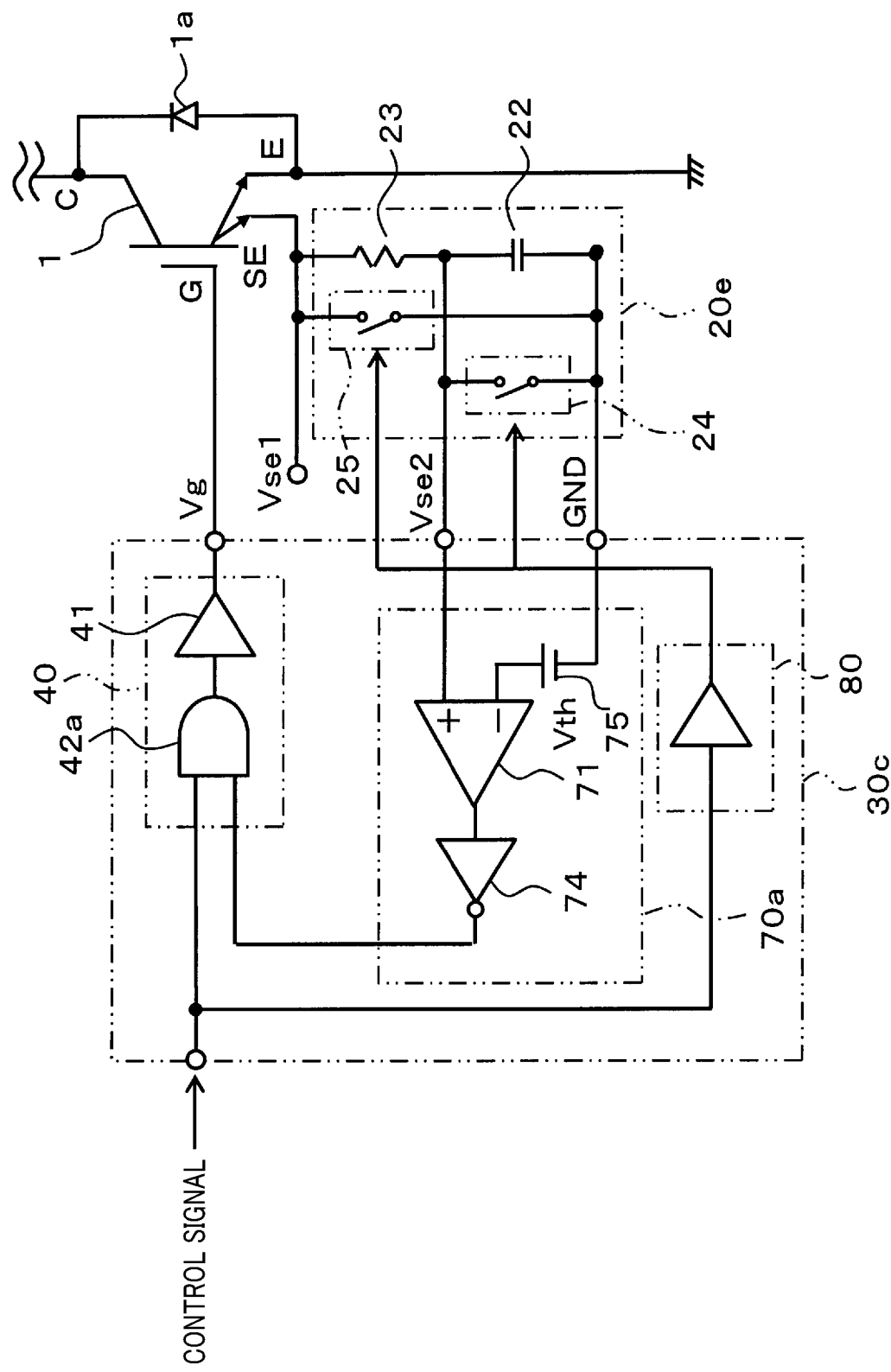
FIG. 37 is a specific electrical configuration diagram showing a thirteenth embodiment.

FIG. 37 shows the thirteenth embodiment, and parts different from the twelfth embodiment will be described below. In this embodiment, the configuration of an impedance part 20e has two switches 24, 25 provided as a discharge switch.

That is, in FIG. 37, in the impedance part 20e, the switch 24 is connected between both terminals of the capacitor 22 and the switch 25 is connected between both terminals of the series circuit of the resistor 23 and the capacitor 22. The switches 24 and 25 each have a configuration in which the same drive signal is provided from the switch control circuit 80, and in a state in which no control signal is provided from the outside, they are held in an on-state by the switch control circuit 80, and if a control signal is supplied, they shift to an off-state. With this, the capacitor 22 is in a state in which electric charge is discharged through the resistor 23.

Similarly to the above, when a control signal is provided from the outside, the drive circuit 40 applies the gate voltage Vg to the gate G of the IGBT 1 to turn on the IGBT 1. At this time, the switches 24 and 25 each become an open state because a signal of off-operation is provided from the switch control circuit 80. In the IGBT 1, in the normal state, as shown in FIG. 35, the gate voltage Vg increases, goes through the mirror period, and increases to a predetermined level.

Then, when the control signal from the outside changes to a state corresponding to the off-operation at time tz, the drive circuit 40 sets the gate voltage Vg provided to the gate of the IGBT 1 to a low level. With this, the IGBT 1 is turned off and the element current Ic and the gate voltage Vg decrease.

In addition, since both of the switches 24, 25 are turned on by the switch control circuit 80 at the time tz, the series circuit of the capacitor 22 and the resistor 23 is short-circuited. With this, when the switches 24, 25 are turned on, the sense voltage Vse1 changes to the ground level and the sense voltage Vse2 also changes to the ground level due to instantaneous discharge of the electric charge of the capacitor 22.

Consequently, for example, in a case where the resistance value of the resistor 23 is large, with the configuration in which the electric charge of the capacitor 22 is discharged with the switch 25 through the resistor 23 as in the twelfth embodiment, when decrease of the sense voltage Vse2 takes time, providing the switch 24 as in the present embodiment can rapidly decrease the sense voltage Vse2. This enables the drive control while reducing the restriction of the off-period of the IGBT 1.

According to the thirteenth embodiment described above, in addition to the effects of the twelfth embodiment, it is possible to rapidly decrease the sense voltage Vse2 by rapidly decreasing both of the sense voltages Vse1 and Vse2 to the ground level when the IGBT 1 is turned off.

Note that, the configuration of the impedance part 20e used in the above configuration can be applied to the tenth embodiment or the eleventh embodiment so that the sense voltages Vse1, Vse2 are used.

Fourteenth Embodiment

Figure 38:
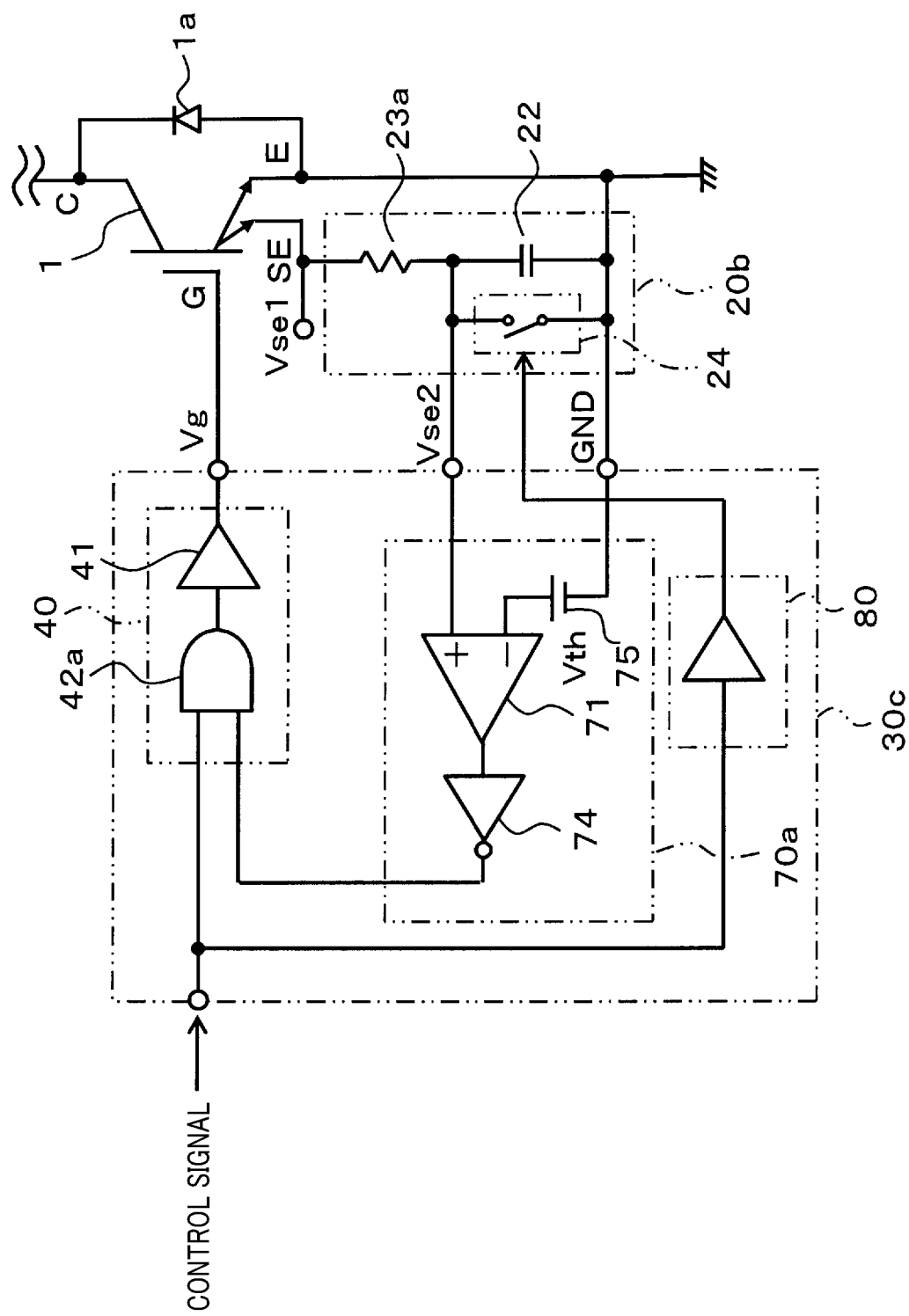
FIG. 38 is a specific electrical configuration diagram showing a fourteenth embodiment.

FIG. 38 shows the fourteenth embodiment, and parts different from the sixth embodiment will be described below. In this embodiment, the configuration of the impedance part 20b is equivalent to that in the sixth embodiment, but the resistance value of a resistor 23a is set small and the capacitance of the capacitor 22 is set large. In this case, the capacitance of the capacitor 22 is preferably set to such a degree that transient current can be absorbed. The resistor 23a may have a resistance value of zero. In this case, the configuration is similar to that of FIG. 16 shown in the seventh embodiment but is different in that it includes the switch 24.

In this configuration, since the resistor 23a has a small resistance value, when the current flows through the resistor 23a, an electrical potential difference between the sense voltages Vse1 and Vse2 is small and they are almost the same level. Therefore, this embodiment adopts a configuration which takes the sense voltage Vse2 in the control circuit 30c as a signal for overcurrent determination instead of using the sense voltage Vse1. The capacitor 22, when the IGBT 1 is turned off, is in a state in which the electric charge is discharged with the switch 24 turned on, and the sense voltage Vse2 is a zero-level.

In the above configuration, when the IGBT 1 is turned on, the switch 24 is turned off and the sense voltage Vse2 gradually increases in a state in which the transient variation is absorbed without exhibiting a peak value or becoming a high voltage during the mirror period. This is because the transient variation amount is absorbed by the capacitor 22, and the sense voltage Vse2 can be obtained as a terminal voltage along with charging of the capacitor 22.

Similarly to the above, the threshold voltage Vth is set to a voltage of the overcurrent level, and thus the sense voltage Vse2 does not exceed the threshold voltage Vth at the normal operation. Then, in a state in which overcurrent flows in the IGBT 1, the sense voltage Vse2 also increases beyond the threshold voltage Vth, and thus it is possible to detect the overcurrent state.

Therefore, also in the fourteenth embodiment described above, effects similar to those of the sixth embodiment can be obtained.

Note that, in this embodiment, the switch 24 is maintained in the off-state, and thus the same operation as that of the seventh embodiment can be performed.

Fifteenth Embodiment

Figure 39:
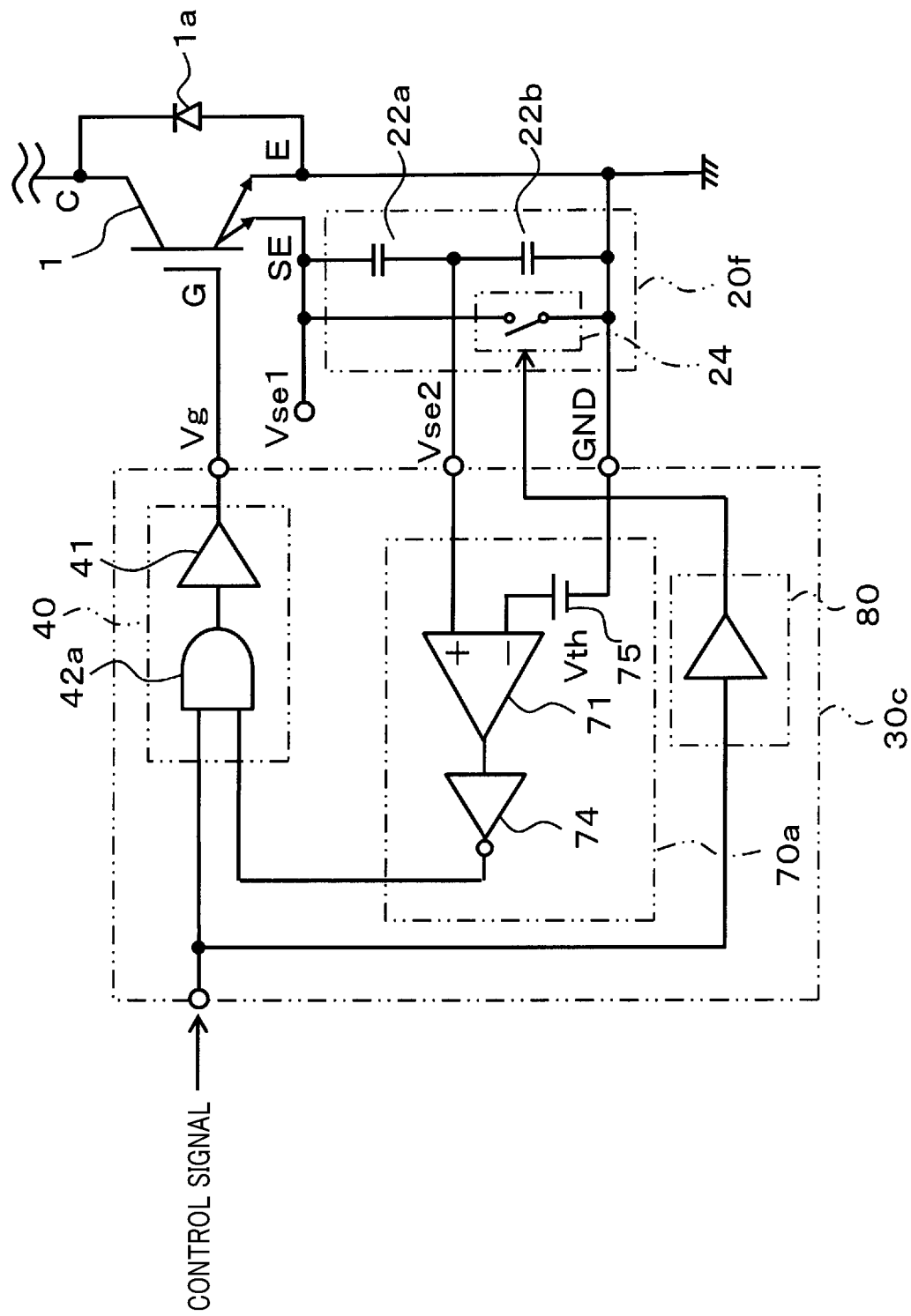
FIG. 39 is a specific electrical configuration diagram showing a fifteenth embodiment.
Figure 40:
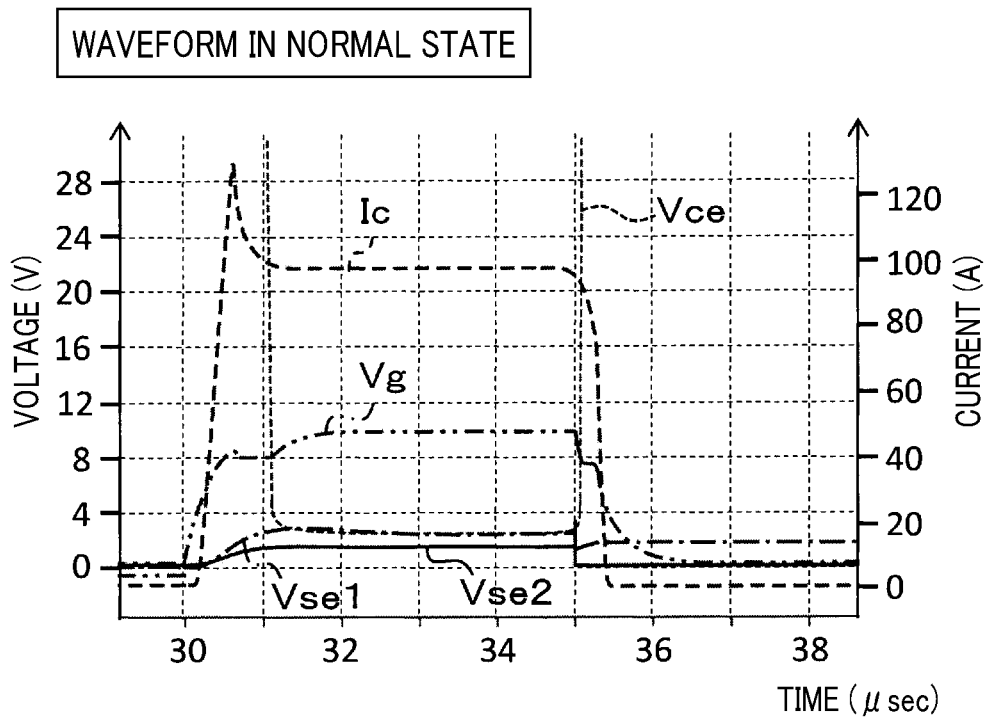
FIG. 40 is a time chart of signals of respective parts in a normal state.
Figure 41:
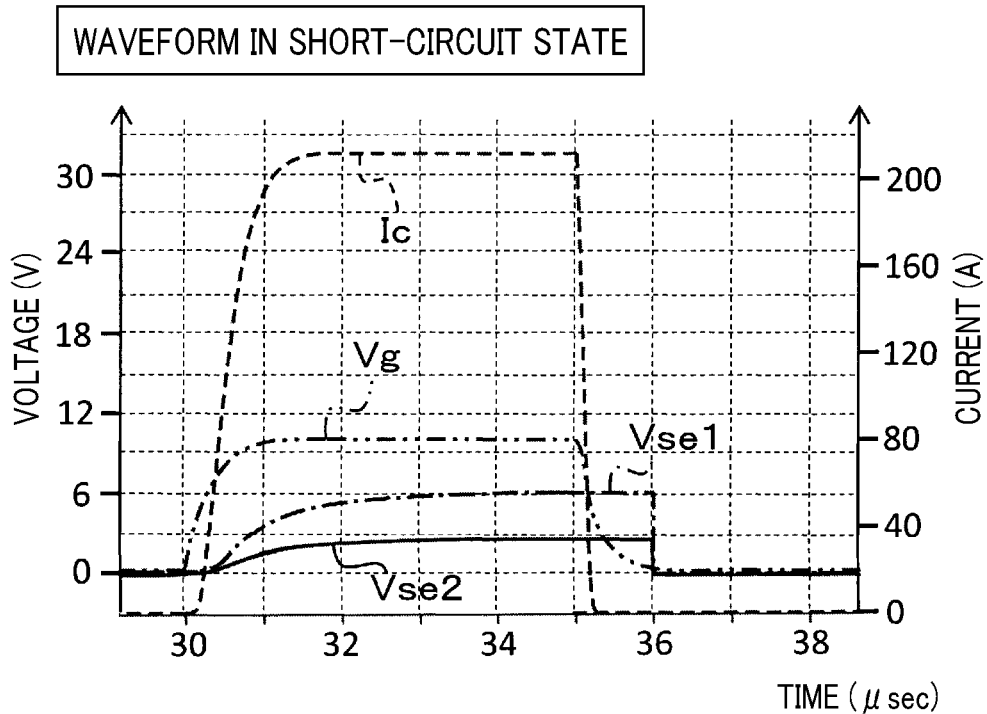
FIG. 41 is a time chart of signals of respective parts in a short-circuit state.

FIG. 39 to FIG. 41 show the fifteenth embodiment, and parts different from the fourteenth embodiment will be described below. While the resistor 23a is provided in the fourteenth embodiment, in the present embodiment, a configuration in which the resistor 23a has a zero-resistance value, that is, is in the short-circuited state is adopted. In addition, in the present embodiment, in place of the capacitor 22, two capacitors 22a, 22b that are connected in series so that a combined capacitance has the same capacitance are provided. The switch 24 is provided as is so as to discharge the electric charge of the two capacitors 22a, 22b.

With this configuration, effects similar to those of the fourteenth embodiment can be obtained, and further the configuration of the series circuit of the capacitors 22a, 22b divides a voltage and takes the divided voltage into the control circuit 30c. With this, the overcurrent detection circuit 70a can receive the low voltage and perform the determination processing.

FIG. 40 and FIG. 41 show simulation results of time change of the element current Ic, and the sense voltages Vse1 and Vse2 after application of the gate voltage Vg to the IGBT 1, in an ordinary state as a normal state and in a short-circuited state, respectively.

In the above configuration, when a control signal is provided from the outside and the gate voltage Vg is applied from the drive circuit 40a to the gate G of the IGBT 1, the IGBT 1 is turned on. At this time, in the IGBT 1, as shown in FIG. 40, the gate voltage Vg and the element current Ic shift similarly to the above and settle to a predetermined level.

At this time, since the transient variation amount is absorbed by the capacitors 22a, 22b, the sense voltages Vse1 and Vse2 gradually increase in a state in which the transient variation is absorbed. In this case, the sense voltage Vse1 is a combined voltage of the terminal voltages of the capacitors 22a and 22b, and the sense voltage Vse2 is obtained as the terminal voltage of the capacitor 22b. In addition, since each terminal voltage of the capacitors 22a and 22b is a shared voltage inversely proportional to the capacitance, the sense voltage Vse2 can be supplied to the overcurrent detection circuit 70a as the low voltage.

Then, in a case where the overcurrent flows in the IGBT 1, as indicated with a solid line in FIG. 41, the sense voltage Vse2 can be obtained at such a voltage level that the overcurrent can be detected as a relatively low voltage. When the sense voltage Vse2 exceeds the threshold voltage Vth, the comparator 71 detects an overcurrent state to turn off the IGBT 1.

Therefore, according to the fifteenth embodiment described above, effects similar to those of the fourteenth embodiment can be obtained and the sense voltage Vse2 can be taken in at the low voltage by the capacitors 22a, 22b that are connected in series, and thus the configuration of the overcurrent detection circuit 70a can be made to be a circuit configuration adapted to the low voltage.

Sixteenth Embodiment

FIG. 42 to FIG. 45 show the sixteenth embodiment. In this embodiment, a specific example of the driver circuit 41 of the drive circuit 40 used in each embodiment described above, or specific examples of the normal drive circuit 43, the clamp circuit 44, and the soft interruption circuit 45 of the drive circuit 40a are shown.

Figure 42:
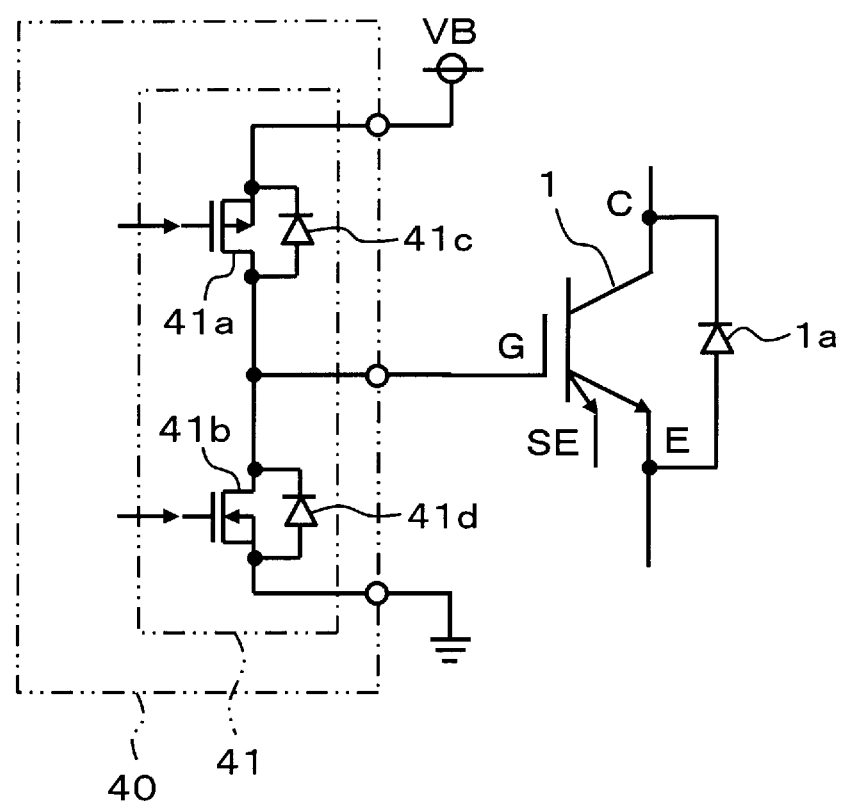
FIG. 42 is an electrical configuration diagram (part 1) showing a sixteenth embodiment.

FIG. 42 shows one example of a specific circuit of the driver circuit 41 of the drive circuit 40 in the first to fifteenth embodiments excluding the tenth embodiment. The driver circuit 41 includes a P-channel MOSFET 41a and an N-channel MOSFET 41b which are connected in series and is connected between a power source VB for gate drive and the IC ground. A common connection point of the MOSFETs 41a and 41b is connected to the gate G of the IGBT 1. Note that, parasitic diodes 41c, 41d exist in the MOSFETs 41a and 41b, respectively.

In the above configuration, when the IGBT 1 is to be driven, the MOSFET 41a is turned on and the MOSFET 41b is turned off, and thereby the gate voltage Vg is applied from the power source VB to the gate G of the IGBT 1.

When the IGBT 1 is to be turned off, the MOSFET 41a is turned off and the MOSFET 41b is turned on, and thereby the electrical potential of the gate G of the IGBT 1 is decreased to the ground level.

Figure 43:
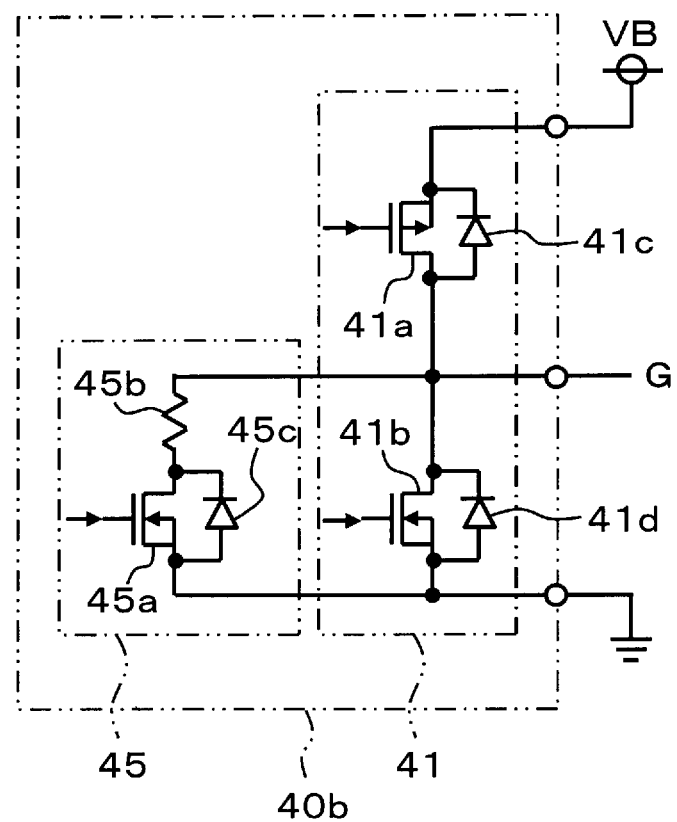
FIG. 43 is an electrical configuration diagram (part 2)

Next, FIG. 43 shows a drive circuit 40b which is configured by adding the soft interruption circuit 45 to the driver circuit 41 shown in FIG. 42. In a case where the overcurrent flows in the IGBT 1 and the IGBT 1 is forcibly made to interrupt, both of the MOSFETs 41a, 41b of the driver circuit 41 are set to the off-state and then the soft interruption circuit 45 is made to operate.

The soft interruption circuit 45 is formed by connecting an N-channel MOSFET 45a between the gate G of the IGBT1 and the ground via a resistor 45b. Note that, a parasitic diode 45c exists in the MOSFET 45a.

As described above, in a case where the overcurrent state of the IGBT1 continues and the IGBT 1 is forcibly turned off, the soft interruption circuit 45 is driven. In this case, both of the MOSFETs 41a and 41b of the driver circuit 41 are turned off and then the MOSFET 45a of the soft interruption circuit 45 is turned on. With this, since the gate G of the IGBT 1 is connected to the ground via the resistor 45b, the electric charge is gradually discharged from the gate G, and thereby the gate voltage Vg gradually decreases and the IGBT 1 shifts to the off-state. This can soft-interrupt the IGBT 1.

Figure 44:
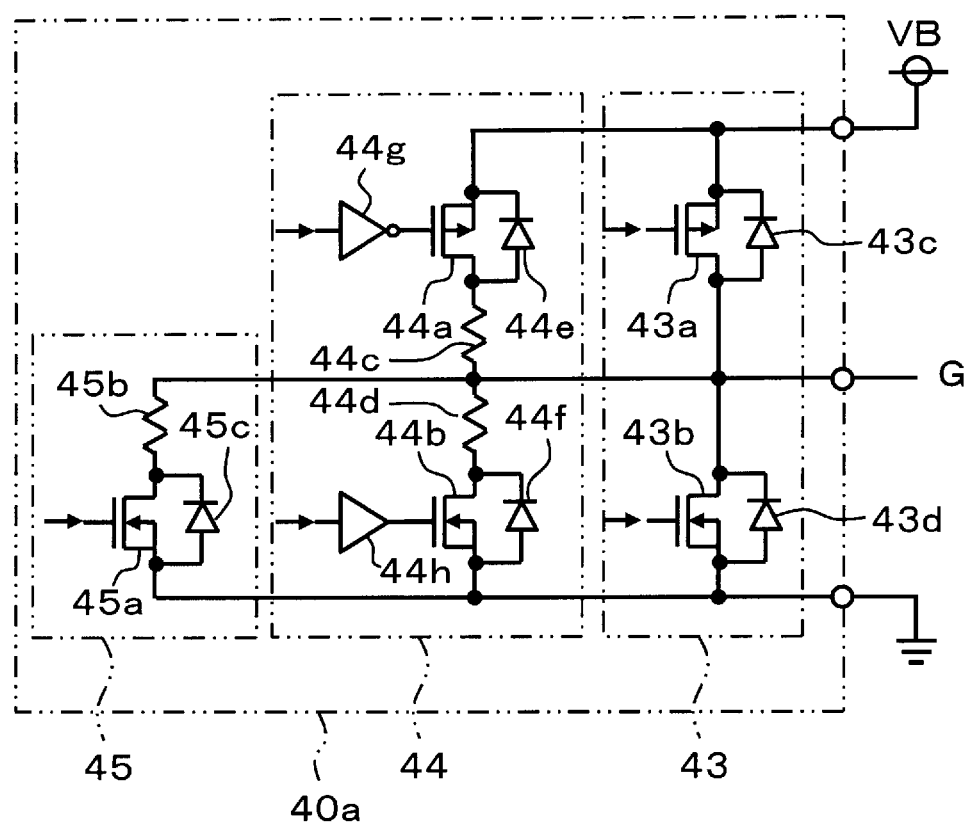
FIG. 44 is an electrical configuration diagram (part 3)

Next, in FIG. 44, a specific circuit of the drive circuit 40a shown in the tenth embodiment will be described. The normal drive circuit 43, similarly to the driver circuit 41, has a configuration in which a P-channel MOSFET 43a and an N-channel MOSFET 43b are connected in series and is connected between the power source VB and the IC ground. A common connection point of the MOSFETs 43a and 43b is connected to the gate G of the IGBT 1. Note that, parasitic diodes 43c, 43d exist in the MOSFETs 43a, 43b, respectively.

The clamp circuit 44 has a configuration in which a P-channel MOSFET 44a and an N-channel MOSFET 44b are connected in series with resistors 44c, 44d interposed therebetween, respectively, and is connected between the power source VB and the IC ground. A common connection point of the resistor 44c and the resistor 44d is connected to the gate G of the IGBT 1. Note that, parasitic diodes 44e, 44f exist in the MOSFETs 44a, 44b, respectively. In addition, the MOSFET 44a is driven via an inverter 44g and the MOSFET 44b is driven by a drive signal based on a clamp signal via a buffer 44h.

The soft interruption circuit 45 is formed by connecting an N-channel MOSFET 45a between the gate G of the IGBT1 and the ground via a resistor 45b. Note that, a parasitic diode 45c exists in the MOSFET 45a.

In a case where the normal drive circuit 43 is operated, this configuration is the same as that of FIG. 42. Then, in a case where the overcurrent flows and the clamp signal is input in a state in which the gate voltage Vg is applied to the gate G of the IGBT 1 to turn on the IGBT 1, both of the MOSFETs 43a, 43b of the normal drive circuit 43 are set to off-states and the clamp circuit 44 is driven.

In the clamp circuit 44, a signal based on the clamp signal is input to the inverter circuit 44g and the buffer circuit 44h. This brings both of the MOSFETs 44a and 44b into on-states. With this, a clamp voltage obtained by dividing the voltage VB applied to the series circuit of the resistors 44c and 44d is applied to the gate G of the IGBT 1. For the clamp voltage, the resistance ratio between the resistors 44c and 44d is set so as to apply the gate voltage Vg capable of suppressing the overcurrent from flowing in the IGBT 1 and the resistance value is appropriately adjusted depending on a speed to shift to the clamp voltage and an allowable consumed current of a drive IC.

Thereafter, in a case where the overcurrent state of the IGBT 1 continues and the IGBT 1 is forcibly turned off, the soft interruption circuit 45 is driven. In this case, the normal drive circuit 43 is maintained in the off-state and both of the MOSFETs 44a, 44b of the clamp circuit 44 are set to the off-state, and the MOSFET 45a of the soft interruption circuit 45 is turned on. Thereby, since the gate G of the IGBT 1 is connected to the ground via the resistor 45b, the electric charge is gradually discharged from the gate G, and thus the gate voltage Vg gradually decreases and the IGBT 1 shifts to the off-state. This can soft-interrupt the IGBT 1.

Figure 45:
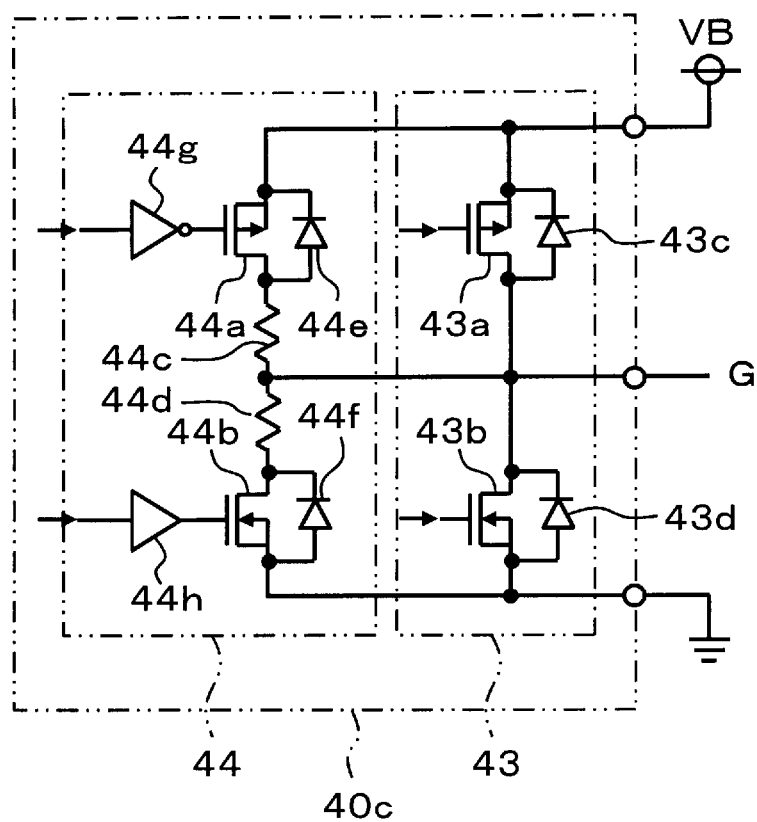
FIG. 45 is an electrical configuration diagram (part 4).

In addition, FIG. 45 shows a drive circuit 40c having a configuration in which the soft interruption circuit 45 is not provided in the configuration of the drive circuit 40a shown in FIG. 43. With this configuration, the clamp circuit 44 also functions as the soft interruption circuit 45.

With this configuration, in a case where the overcurrent state of the IGBT 1 continues and the IGBT 1 is forcibly turned off, the MOSFET 44a of the clamp circuit 44 is turned off and the MOSFET 44b is turned on. Since this connects the gate G of the IGBT 1 to the ground via the resistor 44d, the electric charge is gradually discharged from the gate G, and thus the gate voltage Vg gradually decreases and the IGBT 1 shifts to the off-state. This can soft-interrupt the IGBT 1.

According to the sixteenth embodiment described above, with the addition of the soft interruption circuit 45 to the driver circuit 41, it is possible to protect the IGBT 1 while suppressing generation of the surge voltage by gradually decreasing the gate voltage Vg in the off-operation of the IGBT 1 that is in a state in which the overcurrent flows.

In addition, the clamp circuit 44 can be implemented with a simple configuration, because it has the configuration which applies a predetermined voltage to the gate G of the IGBT 1 by formation of a voltage dividing circuit of the resistors 44c and 44d with both of the MOSFETs 44a and 44b turned on.

Further, since the clamp circuit 44 is made to perform the operation sharing the configuration of the soft interruption circuit 45, the function of the soft interruption circuit 45 can be implemented with a simple configuration.

In the above embodiment, the clamp circuit 44 applies a predetermined voltage to the gate G of the IGBT 1 by the voltage dividing circuit of the resistors 44c and 44d, but not limited to this, for example, it can be also implemented by a constant current circuit.

OTHER EMBODIMENTS

Note that, the present disclosure is not limited only to the above-described embodiments but can be applied to various embodiments within the scope not departing from the spirit of the present disclosure. For example, the present disclosure can be modified or extended as below.

As the IGBT 1, other than the configuration that incorporates a sense element in a main element, a configuration in which a single main element is used may be used, and a sense element externally connected to the main element may be provided.

The switching element is shown in a case of using the IGBT 1 but may be another element. For example, in a case of an MOSFET, an RC-IGBT, or the like, the incorporated diode may be also applied as the diodes 1*a*, 10*a*, 11 shown in FIG. 21.

The present disclosure is described according to the embodiments, but it should be understood that the present disclosure is not limited to the embodiments and the structures thereof. The present disclosure also includes various modifications and variations within an equivalent range. In addition, various combinations and forms, and other combinations and forms including only one or more or less elements of the various combinations and forms are also within the scope and the spirit of the present disclosure.

The invention claimed is:

1. A drive control apparatus for a switching element, the drive control apparatus driving the switching element including a sense element and comprising:
    a drive circuit that provides a gate driving signal to the switching element;
    a transient characteristic absorbing circuit that (1) absorbs a transient characteristic of the sense element when the switching element is turned on and (2) includes a capacitor that is connected in series with a sense resistor and absorbs a transient variation of a sense voltage and a discharge switch for discharging electric charge charged in the capacitor;
    a determination circuit that determines an overcurrent or a short-circuit state of the switching element from an output of the sense element; and
    a current detection circuit that detects, as the sense voltage of the sense element, a terminal voltage of the resistor as a first sense voltage and a terminal voltage of the capacitor as a second sense voltage, and detects the overcurrent or the short-circuit state of the switching element by comparing the first sense voltage with a first threshold voltage, wherein
    the determination circuit is provided to clamp a gate voltage of the switching element, based on a detection signal of the current detection circuit and detect the overcurrent or the short-circuit state of the switching element by comparing the second sense voltage with a second threshold voltage.

2. The drive control apparatus for a switching element according to claim 1, wherein
    the determination circuit is provided to detect an on-voltage from the sense voltage of the sense element and detect the overcurrent or the short-circuit state of the switching element by calculating an element current from the on-voltage and an on-resistance.

3. The drive control apparatus for a switching element according to claim 1, wherein
    the transient characteristic absorbing circuit is provided to cause the discharge switch that discharges electric charge charged in the capacitor to discharge the electric charge through the sense resistor.

4. The drive control apparatus for a switching element according to claim 1, wherein
    the capacitor includes a plurality of capacitors connected in series, and
    an overcurrent detection circuit detects the overcurrent or the short-circuit state of the switching element, based on a terminal voltage divided by the plurality of capacitors.

5. A drive control apparatus for a switching element, the drive control apparatus driving the switching element including a sense element and comprising:
    a drive circuit that provides a gate driving signal to the switching element;
    a transient characteristic absorbing circuit that absorbs a transient characteristic of the sense element when the switching element is turned on; and
    a determination circuit that determines an overcurrent or a short-circuit state of the switching element from an output of the sense element, wherein
    the transient characteristic absorbing circuit includes a capacitor that is connected in series with the sense resistor and absorbs a transient variation of a sense voltage, and a discharge switch for discharging electric charge charged in the capacitor, the discharge switch includes a first discharge switch connected between terminals of the capacitor and a second discharge switch connected between terminals of a series circuit of the capacitor and the sense resistor, and
    the determination circuit is provided to detect an overcurrent or a short-circuit state of the switching element by comparing the sense voltage of the sense element with a threshold voltage.

* * * * *